United States Patent
Yamazaki

(10) Patent No.: US 9,660,104 B2
(45) Date of Patent: May 23, 2017

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/075,671

(22) Filed: Mar. 21, 2016

(65) Prior Publication Data

US 2016/0240693 A1    Aug. 18, 2016

Related U.S. Application Data

(63) Continuation of application No. 13/959,914, filed on Aug. 6, 2013, now Pat. No. 9,293,602.

(30) Foreign Application Priority Data

Aug. 10, 2012  (JP) ................. 2012-178265

(51) Int. Cl.
*H01L 29/786* (2006.01)
*H01L 29/24* (2006.01)
(Continued)

(52) U.S. Cl.
CPC .... *H01L 29/78696* (2013.01); *H01L 27/1225* (2013.01); *H01L 29/045* (2013.01);
(Continued)

(58) Field of Classification Search
None
See application file for complete search history.

(56) References Cited

U.S. PATENT DOCUMENTS 5,731,856 A  3/1998 Kim et al.
5,744,864 A  4/1998 Cillessen et al.
(Continued)

FOREIGN PATENT DOCUMENTS

EP  1737044 A  12/2006
EP  2146379 A   1/2010
(Continued)

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, AGNE Gijutsu Center.
(Continued)

*Primary Examiner* — Whitney T Moore
(74) *Attorney, Agent, or Firm* — Fish & Richardson P.C.

(57) ABSTRACT

A transistor having a multi-layer structure of oxide semiconductor layers is provided in which a second oxide semiconductor layer having a crystalline structure including indium zinc oxide is formed over a first oxide semiconductor layer having an amorphous structure, and at least a third oxide semiconductor layer is formed stacked over the second oxide semiconductor layer. The second oxide semiconductor layer mainly serves as a carrier path for the transistor. The first oxide semiconductor layer and the third oxide semiconductor layer each serve as a barrier layer for suppressing entrance of impurity states of an insulating layer in contact with the multi-layer structure to the carrier path.

23 Claims, 13 Drawing Sheets

(51) Int. Cl.
*H01L 29/04* (2006.01)
*H01L 27/12* (2006.01)

(52) U.S. Cl.
CPC ......... *H01L 29/24* (2013.01); *H01L 29/7869* (2013.01); *H01L 29/78693* (2013.01)

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,232,551 B2 | 7/2012 | Kim et al. |
| 8,274,077 B2 | 9/2012 | Akimoto et al. |
| 8,384,080 B2 | 2/2013 | Taniguchi et al. |
| 8,466,463 B2 | 6/2013 | Akimoto et al. |
| 8,502,221 B2 | 8/2013 | Yamazaki |
| 8,692,252 B2 | 4/2014 | Takata et al. |
| 8,748,215 B2 | 6/2014 | Yamazaki |
| 8,748,881 B2 | 6/2014 | Yamazaki |
| 8,779,420 B2 | 7/2014 | Yamazaki |
| 8,823,092 B2 | 9/2014 | Yamazaki |
| 8,901,557 B2 | 12/2014 | Yamazaki |
| 8,987,731 B2 | 3/2015 | Yamazaki |
| 9,202,927 B2 | 12/2015 | Yamazaki |
| 9,214,520 B2 | 12/2015 | Yamazaki |
| 9,520,287 B2 | 12/2016 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2003/0228760 A1 | 12/2003 | Shiraishi et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0206332 A1 | 8/2009 | Son et al. |
| 2009/0239335 A1 | 9/2009 | Akimoto et al. |
| 2009/0250693 A1 | 10/2009 | Jeong et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0038641 A1 | 2/2010 | Imai |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0224873 A1 | 9/2010 | Sakata et al. |
| 2011/0062436 A1 | 3/2011 | Yamazaki et al. |
| 2011/0089417 A1 | 4/2011 | Yamazaki et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0127523 A1 | 6/2011 | Yamazaki |
| 2011/0140100 A1 | 6/2011 | Takata et al. |
| 2011/0156026 A1 | 6/2011 | Yamazaki et al. |
| 2011/0163311 A1 | 7/2011 | Akimoto et al. |
| 2011/0298027 A1 | 12/2011 | Isobe et al. |
| 2012/0119205 A1 | 5/2012 | Taniguchi et al. |
| 2012/0256179 A1 | 10/2012 | Yamazaki et al. |
| 2012/0305913 A1 | 12/2012 | Yamazaki et al. |
| 2012/0319102 A1 | 12/2012 | Yamazaki et al. |
| 2012/0319183 A1 | 12/2012 | Yamazaki et al. |
| 2013/0320334 A1 | 12/2013 | Yamazaki et al. |
| 2013/0334533 A1 | 12/2013 | Yamazaki |
| 2014/0008647 A1 | 1/2014 | Yamazaki |
| 2014/0014947 A1 | 1/2014 | Yamazaki |
| 2014/0027762 A1 | 1/2014 | Tsurume et al. |

(56) References Cited

U.S. PATENT DOCUMENTS

| | | |
|---|---|---|
| 2014/0042433 A1 | 2/2014 | Yamazaki |
| 2014/0042434 A1 | 2/2014 | Yamazaki |
| 2014/0042435 A1 | 2/2014 | Yamazaki |
| 2014/0042436 A1 | 2/2014 | Yamazaki |
| 2014/0042438 A1 | 2/2014 | Yamazaki |
| 2014/0138674 A1 | 5/2014 | Sato et al. |
| 2016/0163871 A1 | 6/2016 | Yamazaki |
| 2017/0033231 A1 | 2/2017 | Yamazaki |

FOREIGN PATENT DOCUMENTS

| | | |
|---|---|---|
| EP | 2226847 A | 9/2010 |
| EP | 2544237 A | 1/2013 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505317 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2010-021555 A | 1/2010 |
| JP | 2011-086923 A | 4/2011 |
| JP | 2011-124360 A | 6/2011 |
| JP | 2011-135063 A | 7/2011 |
| JP | 2011-135066 A | 7/2011 |
| JP | 2011-138934 A | 7/2011 |
| JP | 2011-243745 A | 12/2011 |
| JP | 2012-015500 A | 1/2012 |
| JP | 2012-134470 A | 7/2012 |
| WO | WO-2004/114391 | 12/2004 |
| WO | WO-2011/033936 | 3/2011 |
| WO | WO-2011/065216 | 6/2011 |
| WO | WO-2011/065243 | 6/2011 |

OTHER PUBLICATIONS

Nathan.A et al., "Amorphous Oxide TFTs: Progress and Issues", SID Digest '12 : SID International Symposium Digest of Technical Papers, Jun. 5, 2012, vol. 43, No. 1, pp. 1-4.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp.567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

(56) References Cited

OTHER PUBLICATIONS

Kim.S et al., "High-Performance oxide thin film transistors passivated by various gas plasmas", 214th ECS Meeting, 2008, No. 2317, ECS.

Kimizuka.n. et al., "SPINEL,YBFe2O4, and YB2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995. vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2)3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

(56) References Cited

OTHER PUBLICATIONS

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Kim.S et al., "4.1 High Performance Oxide Thin Film Transistors with Double Active Layers", IEDM 08: Technical Digest of International Electron Devices Meeting, Dec. 15, 2008.

SEMICONDUCTOR DEVICE AND MANUFACTURING METHOD THEREOF

CROSS-REFERENCE TO RELATED APPLICATIONS

This application is a continuation of U.S. application Ser. No. 13/959,914, filed Aug. 6, 2013, now allowed, which claims the benefit of a foreign priority application filed in Japan as Serial No. 2012-178265 on Aug. 10, 2012, both of which are incorporated by reference.

BACKGROUND OF THE INVENTION

1. Field of the Invention

The present invention relates to a semiconductor device including an oxide semiconductor and a manufacturing method thereof.

In this specification, a semiconductor device generally means a device which can function by utilizing semiconductor characteristics, and an electrooptic device, a semiconductor circuit, and electronic equipment are all semiconductor devices.

2. Description of the Related Art

In recent years, semiconductor devices have been developed to be used mainly for an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, or a memory is mounted on a circuit board, for example, a printed wiring board, to be used as one of components of a variety of electronic devices.

A technique for manufacturing a transistor by using an oxide semiconductor film for a channel formation region, or the like has been attracting attention. Examples of such a transistor include a transistor in which zinc oxide (ZnO) is used as an oxide semiconductor film and a transistor in which $InGaO_3(ZnO)_m$ is used as an oxide semiconductor film.

Non-Patent Document 1 discloses a transistor including a stack of oxide semiconductors. However, in the structure disclosed in Non-Patent Document 1, the oxide semiconductor functioning as a channel is in contact with a silicon oxide film; thus, silicon, a constituent element of the silicon oxide film, might be mixed into the channel as an impurity. The impurity mixed into the channel causes degradation of the electrical characteristics of the transistor.

REFERENCE

Non-Patent Document

[Non-Patent Document 1] Arokia Nathan et al., "Amorphous Oxide TFTs: Progress and Issues", SID 2012 Digest pp. 1-4.

SUMMARY OF THE INVENTION

An object of one embodiment of the present invention is to provide a highly reliable semiconductor device including an oxide semiconductor by preventing a change in its electrical characteristics.

Electrical characteristics of a transistor including an oxide semiconductor vary depending on an interface state between an oxide semiconductor layer and an insulating layer in contact with the oxide semiconductor layer. For example, if trap states (also referred to as interface states) exist at the interface between the oxide semiconductor layer and the insulating layer in contact with the oxide semiconductor layer, the trap states causes a change in the electrical characteristics (e.g., the threshold voltage, the subthreshold swing (S value), or the field-effect mobility) of the transistor.

Further, a transistor using an oxide semiconductor layer and containing many oxygen vacancies through the manufacturing process possesses low long-term reliability. Thus, a transistor is required to be manufactured using an oxide semiconductor layer with oxygen vacancies as little as possible. In addition, damage of plasma exposure to the oxide semiconductor layer in or after the deposition is required to be reduced.

In view of the above, according to one embodiment of the present invention, a transistor having a multi-layer structure of oxide semiconductor layers is manufactured in which a second oxide semiconductor layer having a crystalline structure is stacked over a first oxide semiconductor layer having an amorphous structure, and at least a third oxide semiconductor layer is stacked over the second oxide semiconductor layer.

As the second oxide semiconductor layer having a crystalline structure, an indium zinc oxide layer is provided. The second oxide semiconductor layer having a crystalline structure serves as a main carrier path for the transistor.

The first oxide semiconductor layer and the third oxide semiconductor layer which are respectively provided below and above the second oxide semiconductor layer having a crystalline structure each serve as a barrier layer for suppressing the influence of interface states formed at the interface between an insulating layer which is in contact with the multi-layer oxide semiconductor layer (hereinafter, also referred to as an oxide semiconductor stack) and the oxide semiconductor stack, on the second oxide semiconductor layer which is a carrier path for the transistor, and/or a barrier layer for suppressing entrance of constituent elements of the insulating layer to the second oxide semiconductor layer.

The transistor includes a layer expressed as $InM_XZn_YO_Z$ (X≥1, Y>1, Z>0) as the first oxide semiconductor layer and the third oxide semiconductor layer. The layer contains a stabilizer (e.g., gallium, hafnium, or the like) as M for stabilizing the electrical characteristics of the transistor. Note that constituent elements and the atomic ratios of them of the first oxide semiconductor layer may be the same as or different from those of the third oxide semiconductor layer.

One embodiment of the present invention is a semiconductor device including an oxide semiconductor stack, a gate electrode layer overlapping with the oxide semiconductor stack, a gate insulating layer between the oxide semiconductor stack and the gate electrode layer, and a source electrode layer and a drain electrode layer which are electrically connected to the oxide semiconductor stack. The oxide semiconductor stack includes at least a first oxide semiconductor layer having an amorphous structure, a second oxide semiconductor layer having a crystalline structure over the first oxide semiconductor layer, and a third oxide semiconductor layer over the second oxide semiconductor layer. The semiconductor device includes a layer expressed as $InM_XZn_YO_Z$ (X≥1, Y>1, Z>0) as each of the first oxide semiconductor layer and the third oxide semiconductor layer. The semiconductor device includes an indium zinc oxide layer as the second oxide semiconductor layer.

Another embodiment of the present invention is a semiconductor device including an oxide semiconductor stack, a gate electrode layer overlapping with the oxide semiconductor stack, a gate insulating layer between the oxide semiconductor stack and the gate electrode layer, and a source electrode layer and a drain electrode layer which are electrically connected to the oxide semiconductor stack. The oxide semiconductor stack includes at least a first oxide semiconductor layer having an amorphous structure, a second oxide semiconductor layer having a crystalline structure over the first oxide semiconductor layer, and a third oxide semiconductor layer having an amorphous structure over the second oxide semiconductor layer. The semiconductor device includes a layer expressed as $InM_XZn_YO_Z$ ($X \geq 1$, $Y>1$, $Z>0$) as each of the first oxide semiconductor layer and the third oxide semiconductor layer. The semiconductor device includes an indium zinc oxide layer as the second oxide semiconductor layer.

Another embodiment of the present invention is a semiconductor device including an oxide semiconductor stack, a gate electrode layer overlapping with the oxide semiconductor stack, a gate insulating layer between the oxide semiconductor stack and the gate electrode layer, and a source electrode layer and a drain electrode layer which are electrically connected to the oxide semiconductor stack. The oxide semiconductor stack includes at least a first oxide semiconductor layer having an amorphous structure, a second oxide semiconductor layer having a crystalline structure over the first oxide semiconductor layer, and a third oxide semiconductor layer having a crystalline structure over the second oxide semiconductor layer. The semiconductor device includes a layer expressed as $InM_XZn_YO_Z$ ($X \geq 1$, $Y>1$, $Z>0$) as each of the first oxide semiconductor layer and the third oxide semiconductor layer. The semiconductor device includes an indium zinc oxide layer as the second oxide semiconductor layer.

In the semiconductor device, the concentration of silicon contained in the first oxide semiconductor layer or the third oxide semiconductor layer is preferably lower than or equal to $3 \times 10^{18}/cm^3$.

In the semiconductor device, the concentration of carbon contained in the first oxide semiconductor layer or the third oxide semiconductor layer is preferably lower than or equal to $3 \times 10^{18}/cm^3$.

According to one embodiment of the present invention, a highly reliable semiconductor device including an oxide semiconductor can be obtained by suppressing variations in the electrical characteristics of the semiconductor device.

Note that a semiconductor device according to one embodiment of the present invention includes a transistor using an oxide semiconductor or a circuit including the transistor. For example, electronic devices which include, as a component, a semiconductor integrated circuit including an LSI, a CPU, a power device mounted in a power circuit, a memory, a thyristor, a converter, an image sensor, or the like; an electro-optical device typified by a liquid crystal display panel; or a light-emitting display device including a light-emitting element are included in the category of a semiconductor device.

DETAILED DESCRIPTION OF THE INVENTION

Figure 1A:
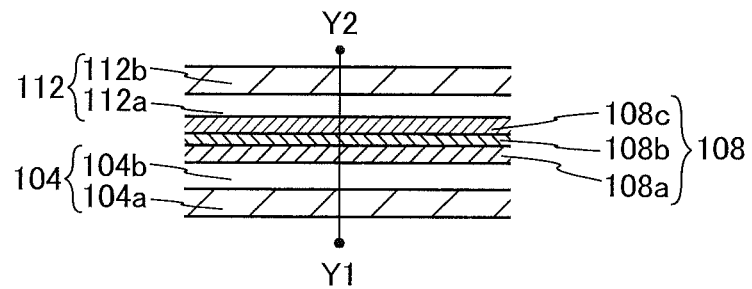
FIGS. 1A to 1C illustrate an example of a stacked-layer structure of a semiconductor device and examples of an energy band diagram thereof.

Hereinafter, embodiments of the present invention will be described in detail with reference to the accompanying drawings. Note that the present invention is not limited to the description below and it is easily understood by those skilled in the art that the mode and details can be changed in various ways. Therefore, the invention should not be construed as being limited to the description in the following embodiments.

Note that in structures of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

Note that in each drawing described in this specification, a size of each component or a thickness of each layer or an area is exaggerated in some cases for clarification. Therefore, embodiments of the present invention are not limited to such scales.

Note that the ordinal numbers such as "first", "second", and the like in this specification and the like are used for convenience and do not denote the order of steps or the stacking order of layers. In addition, the ordinal numbers in this specification do not denote particular names which specify the present invention.

In this specification, a term "parallel" indicates that the angle formed between two straight lines is greater than or equal to −10° and less than or equal to 10°, and accordingly also includes the case where the angle is greater than or equal to −5° and less than or equal to 5. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

Embodiment 1

In this embodiment, a stacked-layer structure included in a semiconductor device of one embodiment of the present invention will be described with reference to FIGS. 1A to 1C.

FIG. 1A is a conceptual drawing of an example of the stacked-layer structure.

The stacked-layer structure included in the semiconductor device includes an oxide semiconductor stack 108 between an insulating layer 104 and an insulating layer 112. The oxide semiconductor stack 108 includes at least a first oxide semiconductor layer 108a having an amorphous structure, a second semiconductor layer 108b having a crystalline structure, and a third oxide semiconductor layer 108c.

In this embodiment, the insulating layer 104 which is placed below the oxide semiconductor stack 108 has a stacked-layer structure of an insulating layer 104a and an insulating layer 104b. Further, the insulating layer 112 which is placed above the oxide semiconductor stack 108 has a stacked-layer structure of an insulating layer 112a and an insulating layer 112b. Note that one embodiment of the present invention is not limited to this.

As the second oxide semiconductor layer 108b having a crystalline structure, an indium zinc oxide layer is provided.

A layer having an amorphous structure and expressed as $InM_XZn_YO_Z$ (X≥1, Y>1, Z>0) is included as the first oxide semiconductor layer 108a below the second oxide semiconductor layer 108b. The layer contains a stabilizer as M for stabilizing the electrical characteristics of the transistor, and specifically one or more of a metal element selected from Ga, Mg, Hf, Al, Sn, Zr, La, Ce, Pr, Nd, Sm, Eu, Gd, Tb, Dy, Ho, Er, Tm, Yb, or Lu.

A layer having an amorphous structure and expressed as $InM_XZn_YO_Z$ (X≤1, Y>1, Z>0) is included as the third oxide semiconductor layer 108c over the second oxide semiconductor layer 108b like the first oxide semiconductor layer 108a. Note that the third oxide semiconductor layer 108c may have an amorphous structure or a crystalline structure.

The constituent elements of the first oxide semiconductor layer 108a may be different from those of the third oxide semiconductor layer 108c, or their constituent elements may be the same at the same atomic ratios or different atomic ratios.

Materials of the first oxide semiconductor layer 108a and the third oxide semiconductor layer 108c are selected as appropriate so that the conduction band, which is a value subtracting the energy gap from the vacuum states has a well-shaped structure between the second oxide semiconductor layer 108b which is an indium zinc oxide layer having a crystalline structure and each of the first oxide semiconductor layer 108a and the third oxide semiconductor layer 108c.

Figure 1B:
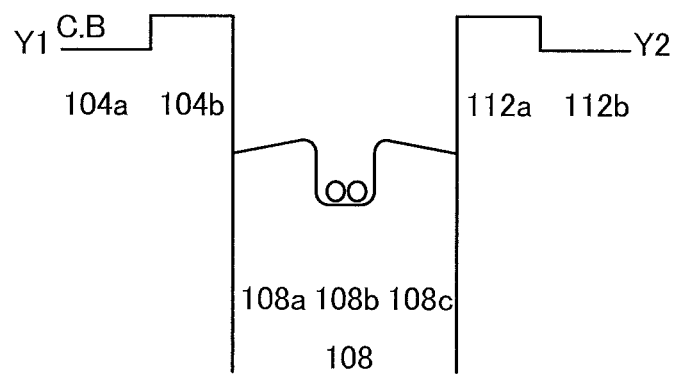

FIG. 1B is an example of the well-shaped structure. FIG. 1B is an energy band diagram between Y1 and Y2 of the stacked-layer structure of FIG. 1A.

In the oxide semiconductor stack 108, when an energy difference exists at the bottom of the conduction band as shown in FIG. 1B, carriers flow through the second oxide semiconductor layer 108b without passing through the first oxide semiconductor layer 108a and the third oxide semiconductor layer 108c. That is, carriers flow through a region separated from the insulating layer 104 and the insulating layer 112 which are provided respectively below and above the oxide semiconductor stack 108 (such a structure is called a buried channel).

Here, the first oxide semiconductor layer 108a and the third oxide semiconductor layer 108c which are respectively provided below and above the second oxide semiconductor layer 108b having a crystalline structure each serve as a barrier layer for suppressing the influence of trap states formed at the interface between the insulating layers 104 and 112 which are in contact with the oxide semiconductor stack 108 and the oxide semiconductor stack 108, on the second oxide semiconductor layer 108b which is a main carrier path for the transistor.

For example, oxygen vacancies contained in the oxide semiconductor layer appear as localized states in deep energy area in the energy gap of the oxide semiconductor. A carrier is trapped in such localized states, so that reliability of the transistor is lowered. For this reason, oxygen vacancies contained in the oxide semiconductor layer need to be reduced. Oxygen vacancies are reduced by an oxygen introduction process for the oxide semiconductor layer or by diffusing oxygen from the insulating layer which is in contact with the oxide semiconductor layer.

However, in the case where the insulating layer which is in contact with the oxide semiconductor layer consists of an element (e.g., silicon) different from the elements in the oxide semiconductor layer, oxygen vacancies are easily formed at the interface between the oxide semiconductor layer and the insulating layer. It is difficult to reduce the oxygen vacancies occurring by the contact between the oxide semiconductor layer and the insulating layer by the above-described processes.

In the oxide semiconductor stack 108, the second oxide semiconductor layer 108b serving as a carrier path is an indium zinc oxide layer, and each of the first oxide semiconductor layer 108a and the third oxide semiconductor layer 108c is an oxide semiconductor layer containing indium and zinc as constituent elements. Therefore, oxygen vacancies at the interface between the second oxide semiconductor layer 108b and the first oxide semiconductor layer 108a and the interface between the second oxide semiconductor layer 108b and the third oxide semiconductor layer 108c are reduced. Accordingly, if an oxygen vacancy is contained in the first oxide semiconductor layer 108a or the third oxide semiconductor layer 108c which are in contact with the insulating layers, the influence of localized states caused by the oxygen vacancy on the second oxide semiconductor layer 108b can be suppressed.

For example, in the second oxide semiconductor layer 108b serving as a carrier path, the absorption coefficient due to localized states measured by a constant photocurrent method (CPM) can be less than or equal to $3 \times 10^{-3}$/cm (less than or equal to $3 \times 10^{13}$/cm$^3$ in terms of density of states).

The first oxide semiconductor layer 108a and the third oxide semiconductor layer 108c also serve as a barrier layer for suppressing entrance of constituent elements of the insulating layers 104 and 112 which are in contact with the oxide semiconductor stack 108 to the second oxide semiconductor layer 108b and generation of impurity states.

For example, in the case of using a silicon-containing insulating layer as each of the insulating layers 104 and 112 which are in contact with the oxide semiconductor stack 108, the silicon in the insulating layers 104 and 112 or carbon which might be contained in the insulating layers can enter the first oxide semiconductor layer 108a or the third oxide semiconductor layer 108c at a depth of several nanometers from the interface. An impurity such as silicon, carbon, or the like entering the oxide semiconductor layer forms impurity states. The impurity states serve as a donor and generates an electron, so that the oxide semiconductor layer may become n-type.

However, when the thickness of the first oxide semiconductor layer 108a and the third oxide semiconductor layer 108c is larger than several nanometers, the impurity such as silicon or carbon does not reach the second oxide semiconductor layer 108b, so that the influence of impurity states is suppressed.

Here, the concentration of silicon or carbon contained in each of the oxide semiconductor layers is lower than or equal to $3\times10^{18}/cm^3$, preferably lower than or equal to $3\times10^{17}/cm^3$. It is particularly preferable to sandwich or surround the second oxide semiconductor layer 108b serving as a carrier path by the first oxide semiconductor layer 108a and the third oxide semiconductor layer 108c in order to prevent entrance of much silicon or carbon, which is a Group 14 element, to the second oxide semiconductor layer 108b. That is, the concentration of silicon and carbon contained in the second oxide semiconductor layer 108b is preferably lower than that in the first oxide semiconductor layer 108a and the third oxide semiconductor layer 108c.

Note that the impurity concentration of the oxide semiconductor layer can be measured by secondary ion mass spectrometry (SIMS).

Note that it is preferable to provide an oxide insulating layer as each of the insulating layers 104b and 112a which are in contact with the oxide semiconductor stack 108, so as to reduce oxygen vacancies at the interfaces of the oxide semiconductor stack 108. For example, a silicon oxide film and a silicon oxynitride film are preferable as the insulating layers 104b and 112a. Note that in the case where oxygen vacancies in the second oxide semiconductor layer 108b are reduced enough not to influence transistor characteristics, the oxide insulating layer is not necessarily provided.

If hydrogen or moisture is contained in the oxide semiconductor layers as an impurity, it can work as a donor and form an n-type region; therefore, in order to achieve a well-shaped structure, it is useful to provide a protective film (a nitride insulating film, or the like) for preventing entrance of hydrogen or moisture from the outside, above or below the oxide semiconductor stack 108. For example, a silicon nitride film is preferably provided as each of the insulating layers 104a and 112b.

Each of the oxide semiconductor layers included in the multi-layer structure contains at least indium (In) and is deposited using a sputtering target with which a film can be formed by an AC sputtering method or a DC sputtering method. When the sputtering target contains indium, the conductivity thereof is increased; therefore deposition by an AC sputtering method or a DC sputtering method is facilitated.

A material which can be expressed as $InGa_XZn_YO_Z$ ($3\leq X\leq6$, $1\leq Y\leq10$, $Z>0$) is preferably used for the first oxide semiconductor layer 108a and the third oxide semiconductor layer 108c. Note that such a material is not suitable when the proportion of Ga in the material is large, because it is difficult to deposit the layer by an AC sputtering method or a DC sputtering method due to powder generated during the deposition. Therefore, the material is preferably used when X is less than or equal to 6.

Note that a material having a lower indium content than indium zinc oxide used for the second oxide semiconductor layer 108b is used for the first oxide semiconductor layer 108a and the third oxide semiconductor layer 108c. The indium and gallium contents in the first, second, and third oxide semiconductor layers can be compared with one another by time-of-flight secondary ion mass spectrometry (also referred to as TOF-SIMS) or X-ray photoelectron spectrometry (also referred to as XPS).

Since in the oxide semiconductor stack employed in one embodiment of the present invention, the second oxide semiconductor layer 108b having a crystalline structure is stacked over the first oxide semiconductor layer 108a having an amorphous structure, the oxide semiconductor stack can be referred to as a hetero structure having different crystal structures.

In the case where an oxide semiconductor layer having a crystalline structure is used as the third oxide semiconductor layer 108c which is provided over the second oxide semiconductor layer 108b and has a different composition from the second oxide semiconductor layer 108b, such a structure can be referred to as a hetero structure having different compositions. In the case where the third oxide semiconductor layer 108c is provided over the second oxide semiconductor layer 108b having a crystalline structure, the third oxide semiconductor layer 108c tends to have a crystalline structure. In this case, it may be difficult to recognize a boundary between the second oxide semiconductor layer 108b and the third oxide semiconductor layer 108c by cross-sectional TEM. However, since the degree of crystallinity of the third oxide semiconductor layer 108c is lower than that of the second oxide semiconductor layer 108b, the boundary can be recognized owing to the degree of crystallinity.

A structure of an oxide semiconductor layer is described below.

An oxide semiconductor layer is classified roughly into a single-crystal oxide semiconductor layer and a non-single-crystal oxide semiconductor layer. The non-single-crystal oxide semiconductor layer includes any of an amorphous oxide semiconductor layer, a microcrystalline oxide semiconductor layer, a polycrystalline oxide semiconductor layer, a c-axis aligned crystalline oxide semiconductor (CAAC-OS) layer, and the like.

The amorphous oxide semiconductor layer has disordered atomic arrangement and no crystalline component. A typical example thereof is an oxide semiconductor layer in which no crystal part exists even in a microscopic region, and the whole of the layer is amorphous.

The microcrystalline oxide semiconductor layer includes a microcrystal (also referred to as nanocrystal) with a size greater than or equal to 1 nm and less than 10 nm, for example. Thus, the microcrystalline oxide semiconductor layer has a higher degree of atomic order than the amorphous oxide semiconductor layer. Hence, the density of defect states of the microcrystalline oxide semiconductor layer is lower than that of the amorphous oxide semiconductor layer.

The CAAC-OS layer is one of oxide semiconductor layers including a plurality of crystal parts, and most of each crystal part fits inside a cube whose one side is less than 100 nm. Thus, there is a case where a crystal part included in the CAAC-OS layer fits a cube whose one side is less than 10 nm, less than 5 nm, or less than 3 nm. The density of defect states of the CAAC-OS layer is lower than that of the microcrystalline oxide semiconductor layer. The CAAC-OS layer is described in detail below.

In a transmission electron microscope (TEM) image of the CAAC-OS layer, a boundary between crystal parts, that is, a grain boundary is not clearly observed. Thus, in the CAAC-OS layer, a reduction in electron mobility due to the grain boundary is less likely to occur.

According to the TEM image of the CAAC-OS layer observed in a direction substantially parallel to a sample surface (cross-sectional TEM image), metal atoms are arranged in a layered manner in the crystal parts. Each metal atom layer has a morphology reflected by a surface over which the CAAC-OS layer is formed (hereinafter, a surface over which the CAAC-OS layer is formed is referred to as a formation surface) or a top surface of the CAAC-OS layer, and is arranged in parallel to the formation surface or the top surface of the CAAC-OS layer.

On the other hand, according to the TEM image of the CAAC-OS layer observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS layer.

A CAAC-OS layer is subjected to structural analysis with an X-ray diffraction (XRD) apparatus. For example, when the CAAC-OS layer including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS layer have c-axis alignment, and that the c-axes are aligned in a direction substantially perpendicular to the formation surface or the top surface of the CAAC-OS layer.

On the other hand, when the CAAC-OS layer is analyzed by an in-plane method in which an X-ray enters a sample in a direction perpendicular to the c-axis, a peak appears frequently when 2θ is around 56°. This peak is derived from the (110) plane of the InGaZnO$_4$ crystal. Here, analysis (φ□ scan) is performed under conditions where the sample is rotated around a normal vector of a sample surface as an axis (φ□ axis) with 2θ fixed at around 56°. In the case where the sample is a single-crystal oxide semiconductor layer of InGaZnO$_4$, six peaks appear. The six peaks are derived from crystal planes equivalent to the (110) plane. On the other hand, in the case of a CAAC-OS layer, a peak is not clearly observed even when φ scan is performed with 2θ fixed at around 56°.

According to the above results, in the CAAC-OS layer having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS layer or is formed through crystallization treatment such as heat treatment. As described above, the c-axis of the crystal is aligned with a direction parallel to a normal vector of a formation surface or a normal vector of a top surface of the CAAC-OS layer. Thus, for example, in the case where a shape of the CAAC-OS layer is changed by etching or the like, the c-axis might not be necessarily parallel to a normal vector of a formation surface or a normal vector of a top surface of the CAAC-OS layer.

Further, the degree of crystallinity in the CAAC-OS layer is not necessarily uniform. For example, in the case where crystal growth leading to the CAAC-OS layer occurs from the vicinity of the top surface of the layer, the degree of the crystallinity in the vicinity of the top surface is higher than that in the vicinity of the formation surface in some cases. Further, when an impurity is added to the CAAC-OS layer, the crystallinity in a region to which the impurity is added is changed, and the degree of crystallinity in the CAAC-OS layer varies depending on regions.

Note that when the CAAC-OS layer with an InGaZnO$_4$ crystal is analyzed by an out-of-plane method, a peak of 2θ□ may also be observed at around 36°, in addition to the peak of 2θ at around 31°. The peak of 2θ at around 36° indicates that a crystal having no c-axis alignment is included in part of the CAAC-OS layer. It is preferable that in the CAAC-OS layer, a peak of 2θ appears at around 31° and a peak of 2θ does not appear at around 36°.

In a transistor using the CAAC-OS layer, change in electric characteristics due to irradiation with visible light or ultraviolet light is small. Thus, the transistor has high reliability.

Note that each of the oxide semiconductor layers may have a stacked-layer structure including two or more layers of an amorphous oxide semiconductor layer, a microcrystalline oxide semiconductor layer, and a CAAC-OS layer, for example. Note that the first oxide semiconductor layer 108a is an oxide semiconductor layer having an amorphous structure and includes at least an amorphous oxide semiconductor layer. In addition, the second oxide semiconductor layer 108b is an oxide semiconductor layer having a crystalline structure and includes at least any of a microcrystalline oxide semiconductor layer, a polycrystalline oxide semiconductor layer, a CAAC-OS layer, or a single crystal oxide semiconductor layer.

Note that in the oxide semiconductor stack 108, at least the second oxide semiconductor layer 108b is preferably a CAAC-OS (c-axis aligned crystalline oxide semiconductor) layer. In this specification, an oxide semiconductor film including a crystal part whose c-axis is substantially perpendicular to a surface of the oxide semiconductor layer is referred to as a CAAC-OS film.

Note that as described above, the third oxide semiconductor layer over the second oxide semiconductor layer may have a crystalline structure or an amorphous structure.

Note that in the case where the second oxide semiconductor layer and the third oxide semiconductor layer which is formed over and in contact with the second oxide semiconductor layer are both CAAC-OS layers, the crystal structure is preferably continuous between the second oxide semiconductor layer and the third oxide semiconductor layer. The reason is that when the third oxide semiconductor layer is continuous with the second oxide semiconductor layer in terms of crystal structure, density of state (DOS) attributed to oxygen vacancies is less likely to be generated at the interface between the two layers.

In the case where the third oxide semiconductor layer has an amorphous structure, heating temperature in the deposition is lower than that in the case of having a crystalline structure; thus, damage to the second oxide semiconductor layer can be suppressed in the deposition of the third oxide semiconductor layer.

Figure 1C:
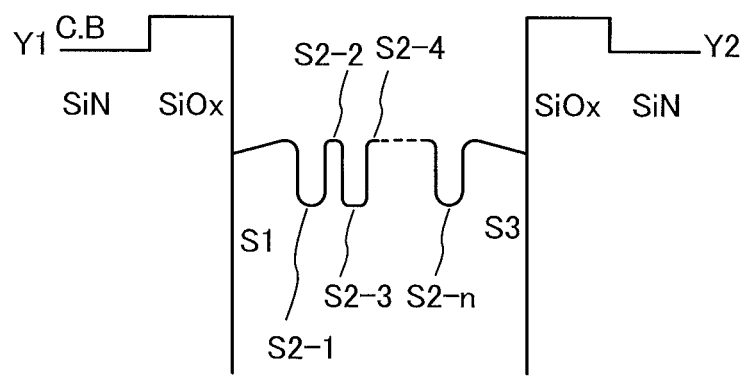

Although the above-described stacked-layer structure is an example in which one well-shaped structure is formed using the first, the second, and the third oxide semiconductor layers, the structure is not particularly limited thereto; a plurality of well-shaped structures may be formed with the second oxide semiconductor layer which has a multi-layer structure, and one example thereof is shown in FIG. 1C.

In FIG. 1C, the first oxide semiconductor layer and the third oxide semiconductor layer correspond to S1 and S3, respectively. The second oxide semiconductor layer serving as a main carrier path corresponds to S2-1 to S2-n.

Note that the ionization potential of an oxide semiconductor can be measured by ultraviolet photoelectron spectroscopy (UPS) or the like. VersaProbe (manufactured by Physical Electronics, Inc. (PHI), a typical measurement apparatus for UPS, is used. The electron affinity refers to a difference in energy between the vacuum level ($E_v$) and a conduction band end ($E_c$). An energy band gap ($E_g$) can be measured with a fully automatic spectroscopic ellipsometer UT-300. The energy of the conduction band is calculated by subtracting the energy band gap from the value of the ionization potential, and a band structure with a single layer or a stacked layer can be formed.

The methods and structures described in this embodiment can be combined as appropriate with any of the methods and structures described in the other embodiments.

Embodiment 2

In this embodiment, a transistor is given as an example of the semiconductor device having a stacked-layer structure in Embodiment 1.

There is no particular limitation on the structure of the transistor that can be applied to a semiconductor device according to one embodiment of the present invention; for example, a staggered type or a planar type having a top-gate structure or a bottom-gate structure can be employed. Further, the transistor may have a single gate structure including one channel formation region, or a multi-gate structure such as a double gate structure including two channel formation regions or a triple gate structure including three channel formation regions. Further, a transistor may have a dual-gate structure including two gate electrodes positioned above and below a channel formation region with gate insulating films provided therebetween.

Figure 2A:
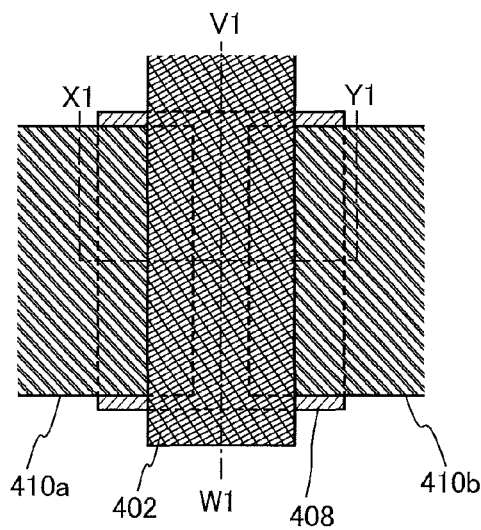
FIG. 2A is a plan view and FIGS. 2B and 2C are cross-sectional views illustrating an example of a structure of a semiconductor device.
Figure 2C:
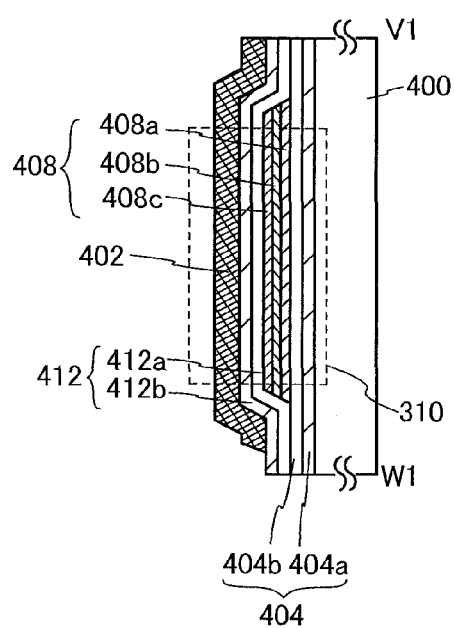
Figure 2B:
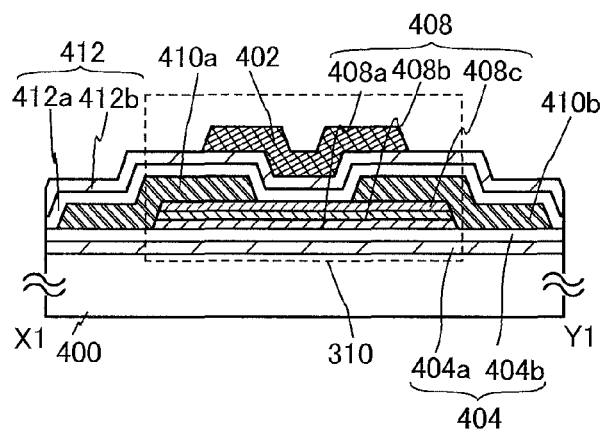

FIGS. 2A to 2C show a structure example of a top-gate transistor 310. FIG. 2A is a plan view of the transistor 310, FIG. 2B is a cross-sectional view taken along dotted line X1-Y1 in FIG. 2A, and FIG. 2C is a cross-sectional view taken along dotted line V1-W1 in FIG. 2A.

The transistor 310 includes an insulating layer 404 over a substrate 400 having an insulating surface, an oxide semiconductor stack 408 over and in contact with the insulating layer 404, a source electrode layer 410a and a drain electrode layer 410b electrically connected to the oxide semiconductor stack 408, a gate insulating layer 412, and a gate electrode layer 402 overlapping with the oxide semiconductor stack 408 with the gate insulating layer 412 provided therebetween.

In this embodiment, the insulating layer 404 has a stacked-layer structure of an insulating layer 404a and an insulating layer 404b over the insulating layer 404a and in contact with the oxide semiconductor stack 408. The gate insulating layer 412 has a stacked-layer structure of a gate insulating layer 412a which is in contact with the source electrode layer 410a and the drain electrode layer 410b and a gate insulating layer 412b over the gate insulating layer 412a.

In the transistor 310, the oxide semiconductor stack 408 includes a first oxide semiconductor layer 408a having an amorphous structure, a second oxide semiconductor layer 408b having a crystalline structure over the first oxide semiconductor layer 408a, and a third oxide semiconductor layer 408c over the second oxide semiconductor layer 408b.

In the transistor of one embodiment of the present invention, an indium zinc oxide layer having a crystalline structure is used as the second oxide semiconductor layer 408b serving as a main carrier path. Note that as the proportion of indium to the other constituent elements is higher, the field-effect mobility of the metal oxide increases; thus, when the second oxide semiconductor layer 408b is formed using an indium zinc oxide, the transistor 310 can have high field-effect mobility. In addition, zinc is preferably included in the metal oxide, in which case an oxide semiconductor layer to be formed can become a CAAC-OS layer relatively easily.

An oxide semiconductor layer including a stabilizer is used as the first oxide semiconductor layer 408a and the third oxide semiconductor layer 408c so that the energy level at the bottom of the conduction band of the indium zinc oxide layer, which is the second oxide semiconductor layer 408b, is lower than the energy level at the bottom of the conduction band of the first oxide semiconductor layer 408a and the third oxide semiconductor layer 408c to make a well-shaped difference in energy at the bottom of the conduction band.

In the oxide semiconductor, as the proportion of a stabilizer to the other metal elements becomes higher, the energy gap of the metal oxide increases. Thus, when the first oxide semiconductor layer 408a and the third oxide semiconductor layer 408c each include a stabilizer, their energy gap can be larger than the energy gap of the second oxide semiconductor layer 408b, which does not include a stabilizer. This makes it easier to form difference in energy at the bottom of the conduction band and make the second oxide semiconductor layer 408b a buried channel.

When the second oxide semiconductor layer 408b serves as a buried channel, interface scattering of carriers is reduced. As a result, high field-effect mobility can be achieved.

In addition, the first oxide semiconductor layer 408a and the third oxide semiconductor layer 408c are provided to suppress carrier trap at each interface with the insulating layer which is in contact with the channel and the oxide semiconductor stack 408, so that the influence of trap states can be reduced at the interfaces and thus a highly reliable transistor can be obtained.

As the stabilizer included in the first oxide semiconductor layer 408a and the third oxide semiconductor layer 408c, one or more metal elements selected from gallium, magnesium, tin, hafnium, aluminum, zirconium, lanthanum, cerium, praseodymium, neodymium, samarium, europium, gadolinium, terbium, dysprosium, holmium, erbium, thulium, ytterbium, and lutetium.

An example of a method for manufacturing the transistor 310 is described below with reference to FIGS. 3A to 3D.

Figure 3A:
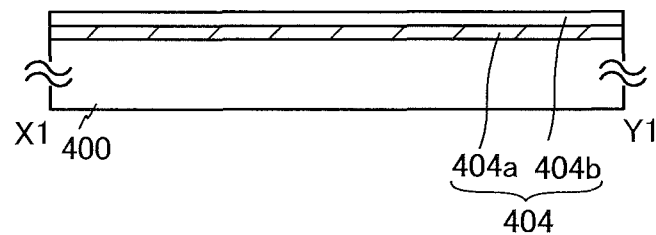
FIGS. 3A to 3D illustrate an example of a manufacturing process of a semiconductor device.

First, over the substrate 400 having an insulating surface, the insulating layer 404 including the insulating layer 404a and the insulating layer 404b is formed (see FIG. 3A).

There is no particular limitation on the substrate that can be used as the substrate 400 having an insulating surface as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 400. Still alternatively, any of these substrates further provided with a semiconductor element may be used as the substrate 400.

The thickness of the insulating layers 404a and 404b is greater than or equal to 1 nm and less than or equal to 100 nm, and they can be formed using a sputtering method, an MBE method, a CVD method, a PLD method, an ALD method, or the like as appropriate.

A silicon nitride film is preferably used as the insulating layer 404a. As the insulating layer 404b, an oxide insulating layer formed of silicon oxide, gallium oxide, aluminum oxide, silicon oxynitride, silicon nitride oxide, hafnium oxide, tantalum oxide, or the like is preferably used.

The insulating layer 404b, which is in contact with an oxide semiconductor layer which is formed later, preferably contains oxygen which exceeds at least the stoichiometric composition in the layer (the bulk).

A 20-nm-thick silicon oxide film is formed by a plasma CVD method as the insulating layer 404b. After the silicon oxide film is formed, radical oxidation treatment using microwave plasma for reducing oxygen vacancies may be performed. For the conditions of the treatment, for example, a high-density plasma apparatus is used, a power of 3800 W is supplied with a power supply of 2.45 GHz, the pressure is 106.67 Pa, the substrate temperature is 325° C., the flow rate of argon is 900 sccm, and the flow rate of oxygen is 5 sccm. Here, a high-density plasma apparatus refers to an apparatus which can realize a plasma density greater than or equal to $1\times10^{11}/cm^3$. For example, plasma is generated by applying a microwave power of 3 kW to 6 kW.

Further, before the insulating layer 404b is formed, plasma treatment in which a high-density plasma apparatus is used and nitrous oxide ($N_2O$) and a rare gas are introduced may be performed.

Figure 3B:
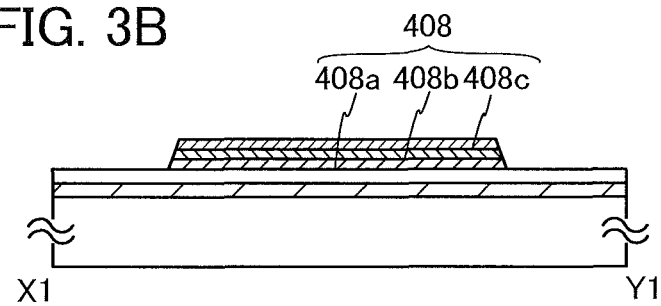

Next, the oxide semiconductor stack 408 is formed over the insulating layer 404b (see FIG. 3B).

To form the oxide semiconductor stack 408, the first oxide semiconductor layer 408a, the second oxide semiconductor layer 408b, and the third oxide semiconductor layer 408c are formed, subjected to heat treatment, and then selectively etched using a mask.

As the first oxide semiconductor layer 408a and the third oxide semiconductor layer 408c, an oxide semiconductor layer containing indium, zinc, and a stabilizer is formed. For example, any of the following can be used: an In—Ga—Zn-based oxide, In—Al—Zn-based oxide, In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no limitation on the ratio of In:Ga:Zn. The In—Ga—Zn-based oxide may contain a metal element other than the In, Ga, and Zn.

An indium zinc oxide layer is formed as the second oxide semiconductor layer 408b.

In the formation of the oxide semiconductor layer, the concentration of hydrogen to be contained is preferably reduced as much as possible.

For example, in this embodiment, the first oxide semiconductor layer 408a is formed using a target having an atomic ratio of In:Ga:Zn=1:3:2.

The thickness of the first oxide semiconductor layer 408a is set to be greater than or equal to 10 nm and less than or equal to 40 nm, preferably greater than or equal to 20 nm and less than or equal to 30 nm. An increase in the thickness of the first oxide semiconductor layer 408a can prevent diffusion of Si from a base film (insulating film containing silicon).

The second oxide semiconductor layer 408b is formed using a target having an atomic ratio of In:Zn=2:1. The second oxide semiconductor layer 408b has a thickness greater than or equal to 5 nm and less than or equal to 10 nm.

The third oxide semiconductor film 408c is deposited using a target having an atomic ratio of In:Ga:Zn=1:3:2. The thickness of the third oxide semiconductor layer 408c is set to be greater than or equal to 10 nm and less than or equal to 40 nm, preferably greater than or equal to 20 nm and less than or equal to 30 nm.

The deposition temperature of the first oxide semiconductor layer 408a to the third oxide semiconductor layer 408c is in the range from 400° C. to 550° C., preferably 450° C. to 500° C.

The heat treatment is performed in reduced pressure or a nitrogen atmosphere at a temperature higher than or equal to 300° C. and lower than or equal to 600° C., preferably higher than or equal to 300° C. lower than or equal to 500° C., further preferably higher than or equal to 350° C. and lower than or equal to 450° C., to remove (dehydrate or dehydrogenate) excess hydrogen (including water and a hydroxyl group) in the oxide semiconductor layers. Then, high-purity oxygen gas, or ultra dry air (the moisture amount is less than or equal to 20 ppm (−55° C. in terms of a dew point), preferably less than or equal to 1 ppm, further preferably less than or equal to 10 ppb, in the measurement with use of a dew point meter of a cavity ring down laser spectroscopy (CRDS) system) is introduced into the same furnace while the heating temperature after finishing the heat treatment is maintained or slow cooling is performed to lower the temperature from the heating temperature. By the effect of the oxygen gas, oxygen which is a main component of the oxide semiconductor and which has been reduced at the same time as the step of removing impurities by dehydration or dehydrogenation can be supplied.

Note that oxygen may be added to the oxides semiconductor stack 408 by an ion implantation method, an ion doping method, a plasma immersion ion implantation method, or the like. The timing and the number of times of supply of oxygen to the oxide semiconductor stack 408 is not particularly limited to the above as long as it is after the formation of the oxide semiconductor stack.

Figure 3C:
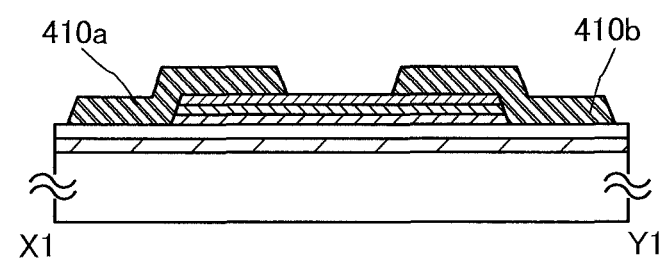

Then, a conductive film is formed over the third oxide semiconductor layer 408c and processed to form the source electrode layer 410a and the drain electrode layer 410b (including a wiring formed with the same layer) (see FIG. 3C).

Note that in the etching for forming the source electrode layer 410a and the drain electrode layer 410b, the oxide semiconductor stack 408 sandwiched between the source electrode layer 410a and the drain electrode layer 410b may be etched at the same time and reduced in thickness. Thus, in some cases, the region of the oxide semiconductor stack 408 not overlapping with the source electrode layer and the drain electrode layer is thinner than the region overlapping with them.

In the oxide semiconductor stack 408, the second oxide semiconductor layer 408b serving as a channel is sandwiched between the first oxide semiconductor layer 408a and the third oxide semiconductor layer 408c. Hence, even when the oxide semiconductor stack 408 is etched concurrently with the etching of the source electrode layer 410a and the drain electrode layer 410b, the second oxide semiconductor layer 408b serving as a channel is hardly etched. Accordingly, there is little possibility that the channel formation region is etched and reduced in film thickness, and thus, stable characteristics can be exhibited.

Next, the gate insulating layer 412 is formed to cover the source electrode layer 410a, the drain electrode layer 410b, and the exposed oxide semiconductor stack 408.

The gate insulating layer 412 can be formed using a single layer or a stack of layers of one or more of the following films formed by a plasma CVD method or a sputtering method: a silicon oxide film, a gallium oxide film, an aluminum oxide film, a silicon nitride film, a silicon oxynitride film, an aluminum oxynitride film, a silicon nitride oxide film, and the like.

In this embodiment, a stacked-layer structure of the gate insulating layer 412a and the gate insulating layer 412b is used. Specifically, a stacked-layer structure of the gate insulating layer 412a including an oxide insulating layer and the gate insulating layer 412b formed of a nitrogen-containing insulating layer is formed.

Note that the gate insulating layer 412a is preferably formed as follows in order to reduce plasma damage: a first oxide insulating film covering the oxide semiconductor stack 408 is formed under deposition conditions with less plasma damage, and an oxide insulating film is stacked over the first oxide insulating film under deposition conditions where much oxygen is contained in the film.

Note that it is preferable that an oxide insulating layer be formed as the gate insulating layer 412a in contact with the oxide semiconductor stack 408 because the oxide insulating layer can supply oxygen to the oxide semiconductor stack 408.

Heat treatment is performed after the gate insulating layer 412a. Since the oxide semiconductor stack 408 is damaged by being exposed to plasma at the time of etching or deposition and thus includes oxygen vacancies due to the damage, the oxygen vacancies are reduced by supply of oxygen by heat treatment for repairing the damage to the oxide semiconductor.

The temperature of the heat treatment is typically higher than or equal to 200° C. and lower than or equal to 450° C. The heat treatment allows nitrogen contained in the gate insulating layer to be released. Note that the heat treatment can eliminate water, hydrogen, and the like from the oxide insulating layer.

In this embodiment, the heat treatment is performed at 350° C. for 1 hour in a mixed atmosphere of nitrogen and oxygen. Hydrogen atoms and oxygen atoms included in the oxide semiconductor stack 408 are bonded in the oxide semiconductor stack 408, at the interface between the oxide semiconductor stack 408 and the gate insulating layer 412, in the gate insulating layer 412, or at the surface of the gate insulating layer 412 by the heat treatment to generate water molecules, and the water molecules are desorbed from the gate insulating layer 412.

In the oxide semiconductor, a position from which the oxygen atom is released serves as an oxygen vacancy.

However, when the insulating layer in contact with the oxide semiconductor stack 408 (i.e., the insulating layer 404 and/or the gate insulating layer 412) contains more oxygen atoms than oxygen in the stoichiometric composition, the oxygen atom moves to the position of the oxygen vacancy, so that the oxygen vacancy is filled with the oxygen atom.

Note that in the case of using a nitrogen-containing oxide insulating layer as the gate insulating layer 412, it is preferable that the number of defects in the nitrogen-containing oxide insulating layer be small, typically the spin density of a signal due to a dangling bond of silicon, which appears when g is 2.001, be lower than or equal to $3 \times 10^{17}$ spins/cm$^3$ by ESR measurement. This is because if the density of defects in the nitrogen-containing oxide insulating layer is high, oxygen is bonded to the defects and the amount of oxygen that passes through the nitrogen-containing oxide insulating layer is decreased.

In this manner, nitrogen, hydrogen, or water is desorbed from the oxide semiconductor stack 408 by the heat treatment after the formation of the gate insulating layer 412, whereby the nitrogen, hydrogen, or water content of the films can be reduced to approximately one tenth.

Figure 3D:
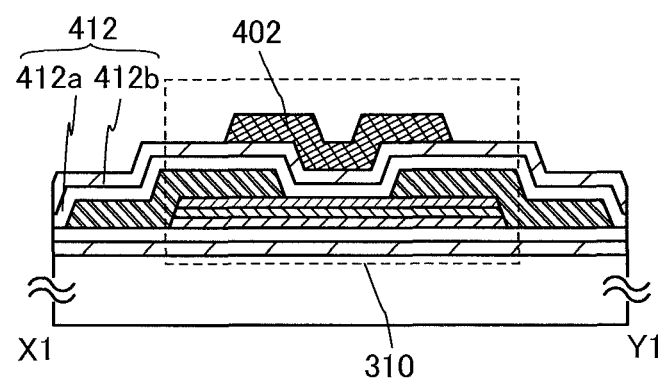

Next, the gate electrode layer 402 (including a wiring formed using the same layer) is formed over the gate insulating layer 412 (see FIG. 3D).

The gate electrode layer 402 can be formed using a metal material such as molybdenum, titanium, tantalum, tungsten, aluminum, copper, chromium, neodymium, or scandium, or an alloy material containing any of these materials as a main component. Alternatively, a semiconductor film typified by a polycrystalline silicon film doped with an impurity element such as phosphorus, or a silicide film such as a nickel silicide film may be used as the gate electrode layer 402. The gate electrode layer 402 may have either a single-layer structure or a stacked-layer structure. The gate electrode layer 402 may have a tapered shape with a taper angle of greater than or equal to 15° and less than or equal to 70° for example. The taper angle here refers to an angle formed by the side surface of a layer which has a tapered shape and the bottom surface of the layer.

The material of the gate electrode layer 402 may be a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added.

Alternatively, as the material of the gate electrode layer 402, an In—Ga—Zn-based oxide containing nitrogen, an In—Sn-based oxide containing nitrogen, an In—Ga-based oxide containing nitrogen, an In—Zn-based oxide containing nitrogen, an Sn-based oxide containing nitrogen, an In-based oxide containing nitrogen, or a metal nitride film (such as an indium nitride film, a zinc nitride film, a tantalum nitride film, or a tungsten nitride film) may be used. These materials have a work function of 5 eV or more. Therefore, when the gate electrode layer 402 is formed using any of these materials, the threshold voltage of the transistor can be positive, so that the transistor can be a normally-off switching transistor.

Through the steps, the transistor 310 can be formed.

Note that a protective layer may be formed over the gate electrode layer 402. An aluminum oxide film or a silicon nitride film is formed as the protective insulating layer. The protective insulating layer has a role in preventing mixing of impurities such as hydrogen and moisture from the outside.

FIGS. 4A to 4D illustrate other examples of the oxide semiconductor stack in a top-gate transistor. The structure other than the oxide semiconductor stack is the same as that of the transistor 310 in FIGS. 2A to 2C.

Figure 4A:
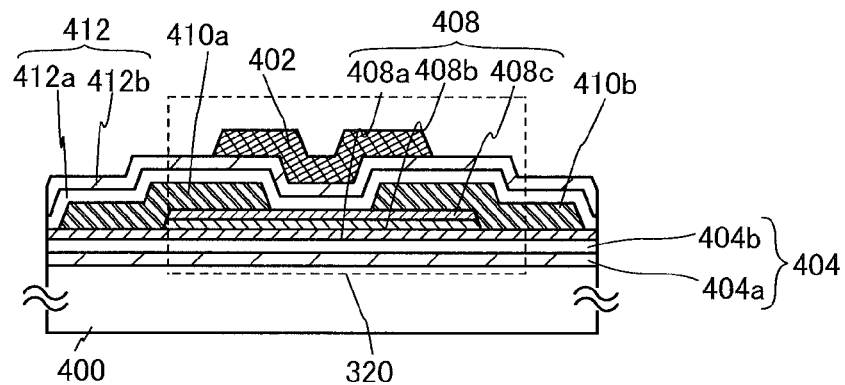
FIGS. 4A to 4D are cross-sectional views illustrating an example of a semiconductor device.

FIG. 4A illustrates a transistor 320 including the oxide semiconductor stack in which the second oxide semiconductor layer 408b and the third oxide semiconductor layer 408c are processed into an island shape and the first oxide semiconductor layer 408a is not processed.

Figure 4B:
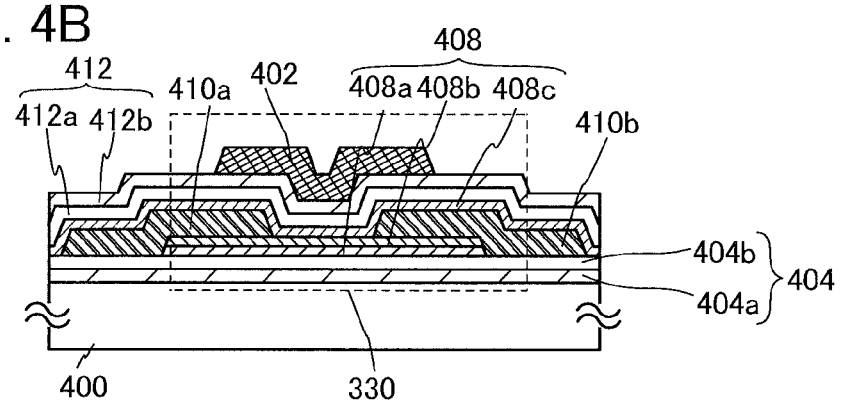

FIG. 4B shows a transistor 330 in which the first oxide semiconductor layer 408a and the second oxide semiconductor layer 408b are processed into an island shape but the third oxide semiconductor layer 408c does not have an island shape and covers the source electrode layer 410a and the drain electrode layer 410b. This structure can be obtained as follows: the source electrode layer 410a and the drain electrode layer 410b are formed over the first oxide semiconductor layer 408a and the second oxide semiconductor layer 408b which are island-shaped, and then, the third oxide semiconductor layer 408c is formed.

Figure 4C:
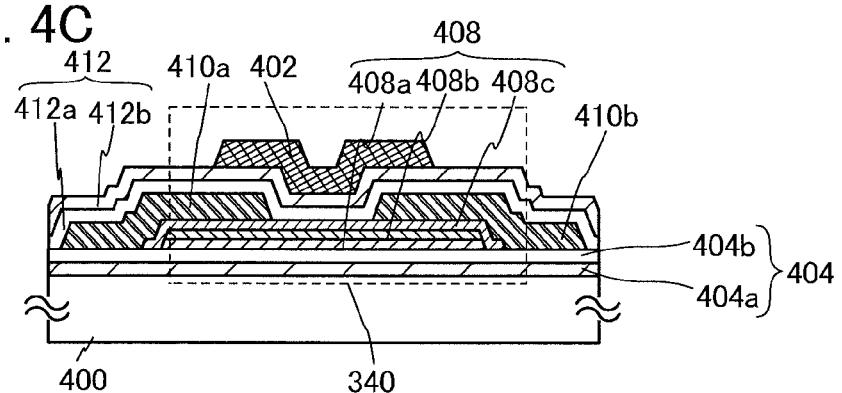

FIG. 4C shows a transistor 340 including the oxide semiconductor stack 408 in which the third oxide semiconductor layer 408c covers side surfaces of each of the first oxide semiconductor layer 408a and the second oxide semiconductor layer 408b. In the transistor 340, ends of the third oxide semiconductor layer 408c are in contact with the insulating layer 404b.

The oxide semiconductor stack 408 in the transistor 340 can be obtained as follows: the third oxide semiconductor layer 408c is formed so as to cover the island-shaped first oxide semiconductor layer 408a and the island-shaped second oxide semiconductor layer 408b and then is processed into an island shape using a mask which is different from the mask used for the processing the first oxide semiconductor layer 408a and the second oxide semiconductor layer 408b.

In the transistor 340, the side surface of the second oxide semiconductor layer 408b serving as a channel is covered with the third oxide semiconductor layer 408c so as not to be in contact with the source electrode layer 410a or the drain electrode layer 410b. Such a structure can reduce generation of leakage current between the source electrode layer 410a and the drain electrode layer 410b of the transistor.

Figure 4D:
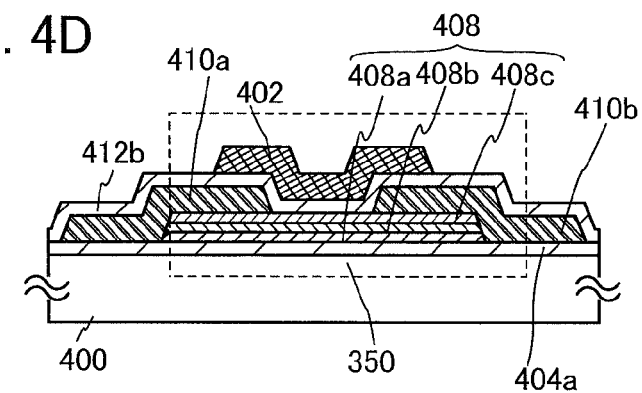

FIG. 4D shows a transistor 350 in which an insulating layer in contact with the oxide semiconductor stack 408 is a single layer. In the transistor 350, the insulating layer 404a and the gate insulating layer 412b are in contact with the oxide semiconductor stack 408. As described above, it is preferable to provide oxide insulating layers as insulating layers in contact with the oxide semiconductor stack 408 (here, the insulating layer 404a and the gate insulating layer 412b) in order to reduce oxygen vacancies at the interfaces between the oxide semiconductor stack 408 and the insulating layers. Note that in the case where oxygen vacancies of the second oxide semiconductor layer 408b are suppressed sufficiently, silicon nitride films are preferably used as the insulating layer 404a and the gate insulating layer 412b in order to prevent entrance of hydrogen or moisture into the oxide semiconductor stack 408.

The stacked-layer structure described in Embodiment 1 can be preferably employed for transistors other than a top-gate transistor.

Figure 5A:
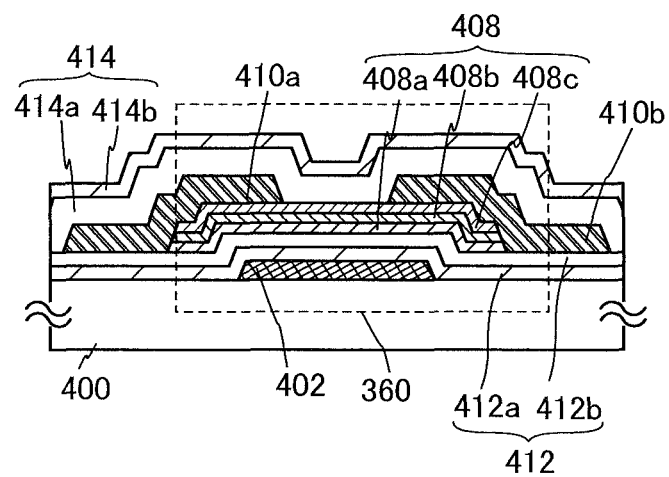
FIGS. 5A and 5B are cross-sectional views illustrating an example of a semiconductor device.
Figure 5B:
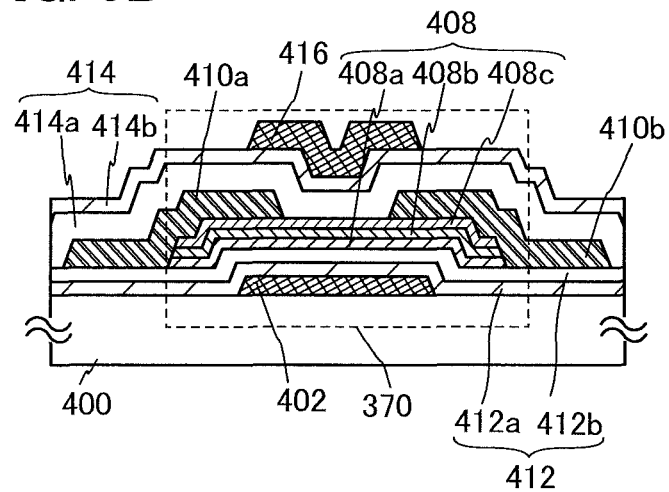

FIGS. 5A and 5B are a bottom-gate transistor 360 and a dual-gate transistor 370, respectively, which have the stacked-layer structure described in Embodiment 1.

The transistor 360 includes the gate electrode layer 402 over the substrate 400 having an insulating surface, the gate insulating layer 412 including the gate insulating layers 412a and 412b over the gate electrode layer 402, the oxide semiconductor stack 408 which is over and in contact with the gate insulating layer 412 and overlaps with the gate electrode layer 402, and the source electrode layer 410a and the drain electrode layer 410b which are electrically connected to the oxide semiconductor stack 408. Note that an insulating layer 414 which covers the source electrode layer 410a and the drain electrode layer 410b and is in contact with the oxide semiconductor stack 408 may be included in the transistor 360 as a component.

As in a top-gate transistor, in the bottom-gate transistor 360, the oxide semiconductor stack 408 includes at least the first oxide semiconductor layer 408a having an amorphous structure, the second semiconductor layer 408b having a crystalline structure and formed of an indium zinc oxide layer, and the third oxide semiconductor layer 408c.

Further, in the transistor 360, the insulating layer 414 has a stacked-layer structure of the insulating layers 414a and 414b. The insulating layer 414a can have a structure similar to the gate insulating layer 404b. The insulating layer 414b can have a structure similar to the gate insulating layer 404a.

The transistor 370 includes the gate electrode layer 402 over the substrate 400 having an insulating surface, the gate insulating layer 412 over the gate electrode layer 402 including the gate insulating layers 412a and 412b, the oxide semiconductor stack 408 which is over and in contact with the gate insulating layer 412 and overlaps with the gate electrode layer 402, the source electrode layer 410a and the drain electrode layer 410b which are electrically connected to the oxide semiconductor stack 408, the insulating layer 414 which covers the source electrode layer 410a and the drain electrode layer 410b, are provided over the oxide semiconductor stack 408, and includes the insulating layer 414a and the insulating layer 414b; and the gate electrode layer 416 overlapping with the oxide semiconductor stack 408 with the insulating layer 414 provided therebetween.

As in a top-gate transistor, also in the dual-gate transistor 370, the oxide semiconductor stack 408 includes at least the first oxide semiconductor layer 408a having an amorphous structure, the second semiconductor layer 408b having a crystalline structure and formed of an indium zinc oxide layer, and the third oxide semiconductor layer 408c.

In the transistor 370, the gate electrode layer 416 can have a structure similar to the gate electrode layer 402, and the insulating layer 414 serves as a gate insulating layer.

A signal for controlling on/off state of the transistor is supplied to one of the pair of gate electrode layers included in the transistor 370. The other gate electrode layer may be either in a floating state (electrically insulated state) or a state in which a potential is supplied from another element. In the latter case, potentials with the same level may be applied to both of the gate electrode layers, or a fixed potential such as a ground potential may be applied only to the other of the gate electrode layer. By controlling the level of potential supplied to the other of the gate electrode layers, the threshold voltage of the transistor 370 can be controlled.

Note that the structures of the transistors illustrated in FIGS. 2A to 2C, FIGS. 4A to 4D, and FIGS. 5A and 5B are partly different from one another, however, embodiments of the present invention are not limited to these structures, and various combinations are possible. For example, a bottom-gate transistor or a dual-gate transistor may have the following structure: in the oxide semiconductor stack 408, the third oxide semiconductor layer 408c covers the side surfaces of each of the first oxide semiconductor layer 408a and the second oxide semiconductor layer 408b. In addition, only the second oxide semiconductor layer 408b in the oxide semiconductor stack 408 may be processed into an island shape.

In any case, providing the first oxide semiconductor layer and the third oxide semiconductor layer below and above the second oxide semiconductor layer having a crystalline structure can suppress the influence of interface states formed at the interfaces between the oxide semiconductor stack and the insulating layers on the second oxide semiconductor layer which is a carrier path for the transistor can be suppressed. Further, the influence of impurity states due to an impurity which might be contained in the oxide semiconductor stack on a carrier path of the transistor can be reduced.

Thus, electrical characteristics of the transistor having the multi-layer structure are stabilized and thus the reliability can be improved.

The methods and structures described in this embodiment can be combined as appropriate with any of the methods and structures described in the other embodiments.

Embodiment 3

In this embodiment, a CAAC-OS layer is described in detail as an example of an oxide semiconductor layer having a crystalline structure which can be used as the second oxide semiconductor layer and/or the third oxide semiconductor layer.

Figure 12:
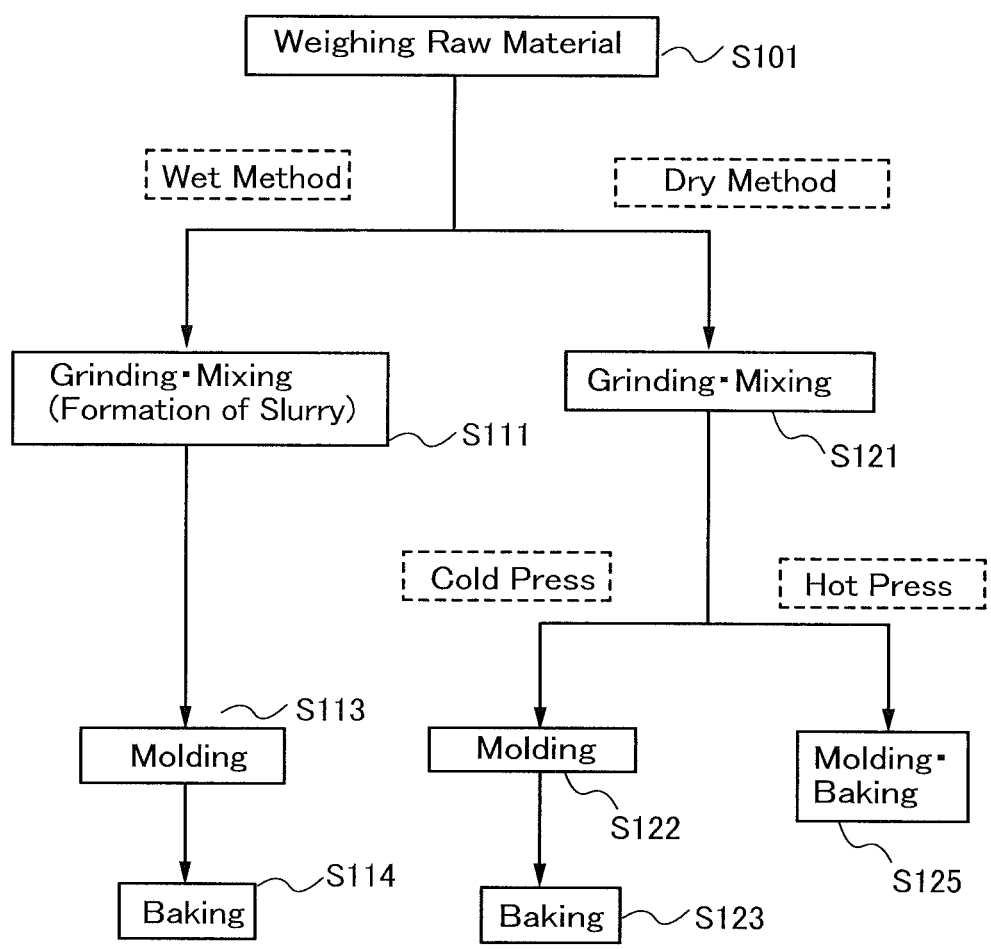
FIG. 12 is a flowchart illustrating an example of a manufacturing process of a sputtering target.

The CAAC-OS layer is formed using a sputtering target. Here, methods for manufacturing sputtering targets each including an oxide semiconductor having a crystal part in which the direction of the c-axis is parallel to a normal vector of the top surface of the oxide semiconductor will be described (see FIG. 12).

First, raw materials for the sputtering target are weighed (step S101).

Here, an $InO_X$ raw material (a raw material of In), a $GaO_Y$ raw material (a raw material of Ga), and a $ZnO_Z$ raw material (a raw material of Zn) are prepared as raw materials for the sputtering target. Note that X, Y, and Z are each a given positive number, for example, X, Y, and Z are 1.5, 1.5, and 1, respectively. It is needless to say that the above raw materials are an example, and raw materials can be selected as appropriate in order to obtain a desired compound. For example, a $MO_Y$ raw material may be used instead of the $GaO_Y$ raw material. Note that Sn, Hf, or Al can be used as M. Alternatively, the following lanthanoid may be used as M: La, Ce, Pr, Nd, Sm, Eu, Gd, Tb, Dy, Ho, Er, Tm, Yb, or Lu.

Note that an $InO_X$ raw material (a raw material of In) and a $ZnO_Z$ raw material (a raw material of Zn) are prepared for the sputtering target for the second oxide semiconductor layer.

Although the case where three kinds of raw materials are used is shown as an example in this embodiment, one embodiment of the present invention is not limited thereto. For example, this embodiment may be applied to the case where four or more kinds of raw materials are used or the case where one or two kinds of raw materials are used.

Next, the $InO_X$ raw material, the $GaO_Y$ raw material, and the $ZnO_Z$ raw material are mixed in a predetermined ratio.

For example, the predetermined ratio of the $InO_X$ raw material, the $GaO_Y$ raw material, and the $ZnO_Z$ raw material is 2:2:1, 8:4:3, 3:1:1, 1:1:1, 1:3:2, 4:2:3, 1:1:2, 3:1:4, or 3:1:2 in a molar ratio. With the use of a mixed material having such a ratio, a sputtering target including an oxide semiconductor having a crystal region in which the direction of the c-axis is parallel to a normal vector of the top surface of the oxide semiconductor can be easily obtained.

More specifically, in the case of forming a sputtering target of In—Ga—Zn-based oxide having a composition of In:Ga:Zn=□1:1:1 [atomic ratio], the raw materials are weighed so that $In_2O_3$:$Ga_2O_3$:ZnO=□1:1:1 [molar ratio].

Note that also in the case where the $MO_Y$ raw material is used instead of the $GaO_Y$ raw material, the ratio of the $InO_X$ raw material, the $MO_Y$ raw material, and the $ZnO_Z$ raw material is 2:2:1, 8:4:3, 3:1:1, 1:1:1, 1:3:2, 4:2:3, 1:1:2, 3:1:4, or 3:1:2 in a molar ratio.

A method for forming the sputtering target using a wet method is described. The raw materials for the sputtering target are weighed, and then, the raw materials are ground and mixed with a ball mill or the like to obtain compound powder. After a plurality of raw materials is mixed thereto, first baking is performed to generate a crystalline oxide. Then, the crystalline oxide is crushed to be compound power. The grain size of the compound powder is greater than or equal to 0.01 μm and less than or equal to 1 μm, preferably greater than or equal to 0.01 μm and less than or equal to 0.5 μm, further preferably greater than or equal to 0.01 μm and less than or equal to 0.3 μm. Ion-exchange water, an organic additive, and the like are further mixed into the compound powder to form slurry (step S111).

Then, the slurry is poured into a mold provided with a moisture-permeable filter, so that moisture is removed. The mold may be formed using a metal or an oxide and the upper shape thereof is rectangular or rounded. The mold can be provided with one or more holes at the bottom. With the plural holes, moisture of the slurry can be removed rapidly. A porous resin, cloth, or the like may be used for the filter.

Moisture is removed from the slurry in such a manner that water is removed under reduced pressure through the hole provided at the bottom of the mold into which the slurry is poured. Next, the slurry from which moisture has been removed under reduced pressure is naturally dried. Thus, the slurry from which moisture has been removed is molded into the internal shape of the mold (step S113).

Then, the molded body is baked (second baking) in an oxygen ($O_2$) atmosphere at a temperature of 1400° C. (step S114). Through the steps, the sputtering target can be obtained using a wet method.

Next, a method for forming the sputtering target using a dry method will be described. The raw materials for the sputtering target are weighed, and then, the raw materials are ground and mixed with a ball mill or the like to obtain compound powder (step S121).

The compound powder obtained is spread over a mold, and pressure is applied thereto with a pressing machine, whereby the compound powder is molded to obtain a molded body (step S122).

The molded body is placed in a heating apparatus such as an electric furnace and baked in an oxygen ($O_2$) atmosphere at a temperature of 1400° C. (step S123). Note that in this embodiment, a method in which a molding step and a baking step are separated as in step S122 and step S123 is referred to as a cold press method. As a comparison example of a cold press method, a hot press method in which a molding step and a baking step are concurrently performed will be described below.

First, the above-described steps up to step S121 are performed. The compound powder obtained is spread over the mold, and pressure is applied with a pressing machine to the compound powder provided on the inner side of the mold while the mold is heated in an argon (Ar) atmosphere at a temperature of 1000° C. In this manner, pressure is applied to the compound powder with the compound powder baked, whereby the compound powder can be molded to obtain a molded body (step S125).

Through the steps, a CAAC-OS layer can be used with the use of the manufactured sputtering target.

Note that, in an $InGaZnO_4$ crystal structure of the manufactured sputtering target containing $InGaZnO_4$, bonding between In—O coupling planes is weak and thus cleavage easily occurs at a plane perpendicular to a c-axis (i.e., an a-b plane).

A phenomenon occurring when an In—Ga—Zn-based oxide film is deposited using such a sputtering target so that it is easily cleaved along the plane perpendicular to the c-axis (the a-b plane) will be described.

When ions collide with the surface of the sputtering target, the crystal part included in the sputtering target is cleaved along the a-b plane, and sputtered particles whose top and bottom surfaces are each aligned with a layer parallel to the a-b plane (flat-plate-like sputtered particle or pellet-like sputtered particle) are separated from the sputtering target. Assuming that the crystalline particle which is sputtered and released on a surface of a sputtering target has c-axis alignment and is a flat-plate-like sputtered particle, the outermost plane of the flat-plate-like sputtered particle is preferably a (Ga, Zn)O plane.

In film formation, when the oxygen flow rate is high and the pressure inside a chamber is high, oxygen ions are attached to the flat-plate-like sputtered particle, so that the flat-plate-like sputtered particle can have much oxygen on its surface. Another flat-plate-like sputtered particle is stacked thereover before the attached oxygen is released; thus, much oxygen can be contained in the film. The oxygen adsorbed on the surface contributes to a reduction in the number of oxygen vacancies in the oxide semiconductor film.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

By reducing the amount of impurities entering the CAAC-OS layer during the deposition, the crystalline state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

To form an oxide semiconductor layer having a crystalline region with c-axis alignment, it is preferable to increase the substrate temperature at the deposition. The temperature is higher than or equal to 200° C. and lower than or equal to 550° C.

In film formation, the flat-plate-like sputtered particle reaches the substrate surface while keeping its crystalline state, whereby formation of a CAAC-OS layer is facilitated. Further, flat-plate-like sputtered particles are stacked; thus, a CAAC-OS layer is likely to be formed. Note that the CAAC-OS layer contains a large amount of oxygen and is reduced in oxygen vacancies.

Next, a manufacturing apparatus for depositing the oxide semiconductor stack using the sputtering target is described.

Note that each of the oxide semiconductor layers included in the oxide semiconductor stack is preferably stacked continuously without exposure to air. In this case, a manufacturing apparatus whose top view is illustrated in FIG. 13 can be used.

Figure 13:
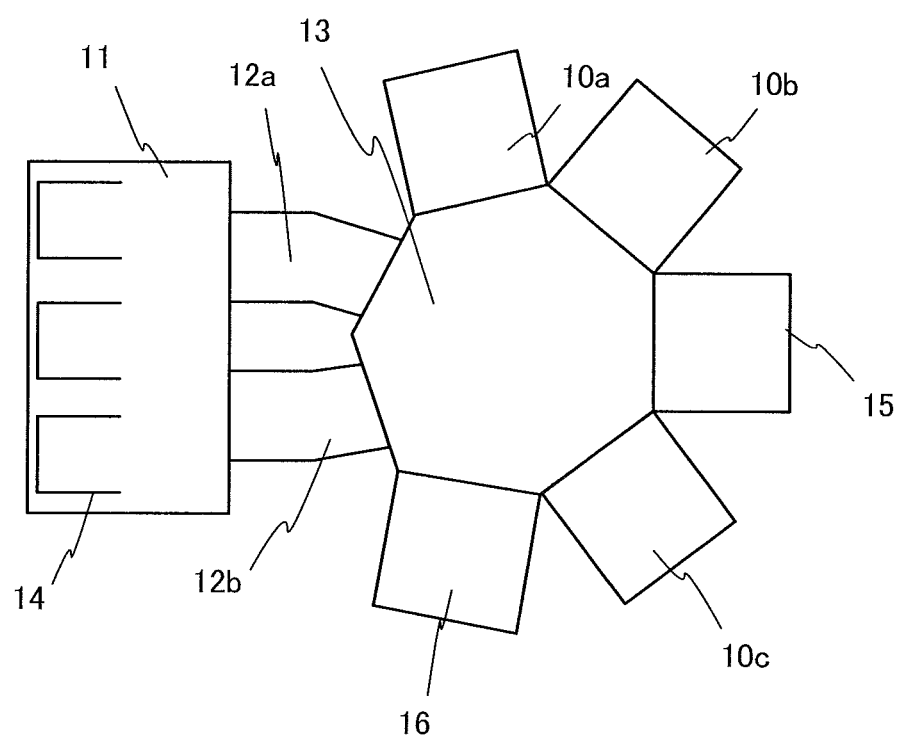
FIG. 13 is a diagram illustrating a manufacturing apparatus capable of manufacturing a semiconductor device.

The manufacturing apparatus illustrated in FIG. 13 is single wafer multi-chamber equipment, which includes three sputtering devices 10a, 10b, and 10c, a substrate supply chamber 11 provided with three cassette ports 14 for holding a process substrate, load lock chambers 12a and 12b, a transfer chamber 13, substrate heating chambers 15 and 16, and the like.

Note that a transfer robot for transferring a substrate to be treated is provided in each of the substrate supply chamber 11 and the transfer chamber 13. The atmospheres of the sputtering devices 10a, 10b, and 10c, the transfer chamber 13, and the substrate heating chambers 15 and 16 are preferably controlled so as to hardly contain hydrogen and moisture (i.e., as an inert atmosphere, a reduced pressure atmosphere, or a dry air atmosphere). For example, a preferable atmosphere is a dry nitrogen atmosphere in which the dew point of moisture is −40° C. or lower, preferably −50° C. or lower.

An example of a procedure of the manufacturing steps with use of the manufacturing apparatus illustrated in FIG. 13 is as follows. The process substrate is transferred from the substrate supply chamber 11 to the substrate heating chamber 15 through the load lock chamber 12a and the transfer chamber 13; moisture attached to the process substrate is removed by vacuum baking in the substrate heating chamber 15; the process substrate is transferred to the sputtering device 10c through the transfer chamber 13; and the first oxide semiconductor layer is deposited in the sputtering device 10c.

Then, the process substrate is transferred to the sputtering device 10a through the transfer chamber 13 without exposure to air, and the second oxide semiconductor layer is deposited in the sputtering device 10a. Then, the process temperature is transferred to the sputtering device 10b through the transfer chamber 13, and the third oxide semiconductor layer is deposited in the sputtering device 10b. If needed, the process substrate is transferred to the substrate heating chamber 16 through the transfer chamber 13 without exposure to air and heat treatment is performed.

As described above, with use of the manufacturing apparatus illustrated in FIG. 13, a manufacturing process can proceed without exposure to air. Further, with of the sputtering devices in the manufacturing apparatus in FIG. 13, a process performed without exposure to air can be achieved by change of the sputtering target.

As the sputtering devices in the manufacturing apparatus illustrated in FIG. 13, a parallel plate sputtering device, an ion beam sputtering device, a facing-target sputtering device, or the like may be used. In a facing-target type sputtering device, an object surface is separated from plasma and thus damage in deposition is small; therefore, a CAAC-OS layer having high crystallinity can be formed.

A high purity gas having a low concentration of impurities such as hydrogen, water, a hydroxyl group, and hydride is used as a deposition gas for depositing the oxide semiconductor layer in each of the sputtering devices 10a, 10b, and 10c.

The heat treatment may be performed in the substrate heating chamber 16 under reduced pressure, in a nitrogen atmosphere, in an oxygen atmosphere, in ultra-dry air (air in which the moisture amount is less than or equal to 20 ppm (−55° C. by conversion into a dew point), preferably less than or equal to 1 ppm, more preferably less than or equal to 10 ppb, in the measurement with the use of a dew point meter in the cavity ring down laser spectroscopy (CRDS) system), or in a rare gas (argon, helium, or the like) atmosphere. It is preferable that water, hydrogen, and the like be not contained in the nitrogen atmosphere, in the oxygen atmosphere, in the ultra-dry air, in the rare gas atmosphere, or the like. It is also preferable that the purity of nitrogen, oxygen, or the rare gas which is introduced into a heat treatment apparatus be set to be 6N (99.9999%) or higher, preferably 7N (99.99999%) or higher (that is, the impurity concentration is 1 ppm or lower, preferably 0.1 ppm or lower).

Through these steps, an oxide semiconductor stack, in particular, an oxide semiconductor stack including a CAAC-OS layer which can be used as one embodiment of the present invention can be formed.

The methods and structures described in this embodiment can be combined as appropriate with any of the methods and structures described in the other embodiments.

Embodiment 4

Figure 6A:
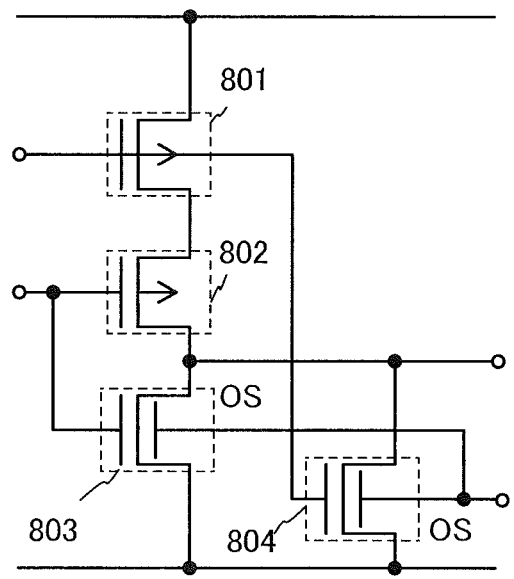
FIGS. 6A and 6B are circuit diagrams each illustrating a semiconductor device of one embodiment of the present invention.
Figure 6B:
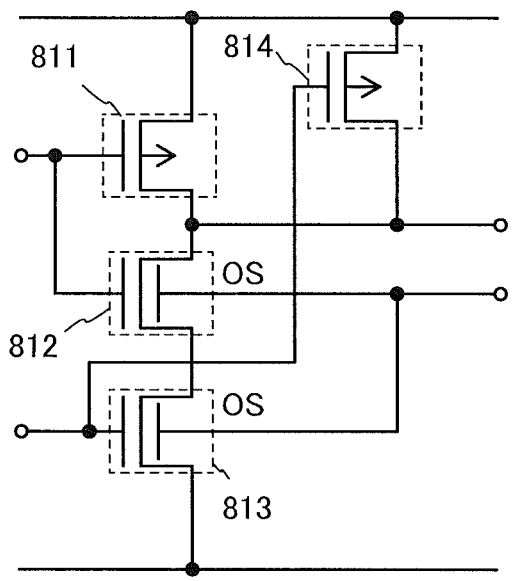

FIG. 6A illustrates an example of a circuit diagram of a NOR circuit, which is a logic circuit, as an example of the semiconductor device described in one embodiment of the present invention. FIG. 6B is a circuit diagram of a NAND circuit.

In the NOR circuit in FIG. 6A, p-channel transistors 801 and 802 are transistors in each of which a channel formation region is formed using a semiconductor material (e.g., silicon) other than an oxide semiconductor, and n-channel transistors 803 and 804 each include an oxide semiconductor stack and are similar to any of the structures of the transistor described in Embodiment 2.

A transistor including a semiconductor material such as silicon can easily operate at high speed. In contrast, charge can be held in a transistor including an oxide semiconductor for a long time owing to its characteristics.

To miniaturize the logic circuit, it is preferable that the n-channel transistors 803 and 804 be stacked over the p-channel transistors 801 and 802. For example, the transistors 801 and 802 can be formed using a single crystal silicon substrate, and the transistors 803 and 804 can be formed over the transistors 801 and 802 with an insulating layer provided therebetween.

Note that in the NOR circuit shown in FIG. 6A, the transistors 803 and 804 have the structure similar to the transistor 520, and by controlling the potential of the second gate electrode, for example, by setting the potential to GND, the threshold voltages of the transistors 803 and 804 are increased, so that the transistors can be normally off.

In the NAND circuit in FIG. 6B, p-channel transistors 811 and 814 are transistors in each of which a channel formation region is formed using a semiconductor material (e.g., silicon) other than an oxide semiconductor, and n-channel transistors 812 and 813 each include an oxide semiconductor stack and are similar to any of the structures of the transistor described in Embodiment 2.

Note that in the NAND circuit shown in FIG. 6B, the transistors 812 and 813 have the structure similar to the transistor 520, and by controlling the potential of the second gate electrode, for example, by setting the potential to GND, the threshold voltages of the transistors 812 and 813 are increased, so that the transistors can be normally off.

As in the NOR circuit shown in FIG. 6A, to miniaturize the logic circuit, it is preferable that the n-channel transistors 812 and 813 be stacked over the p-channel transistors 811 and 814.

By applying a transistor including an oxide semiconductor for a channel formation region and having extremely small off-state current to the semiconductor device in this embodiment, power consumption of the semiconductor device can be sufficiently reduced.

A semiconductor device which is miniaturized, highly integrated, and has stable and excellent electrical characteristics by stacking semiconductor elements including different semiconductor materials and a method for manufacturing the semiconductor device can be provided.

In addition, by employing the structure of the transistor described in Embodiment 2, a NOR circuit and a NAND circuit with high reliability and stable characteristics can be provided.

Examples of a NOR circuit and a NAND circuit using the transistor in Embodiment 2 are described as an example in this embodiment; however, there is no particular limitation to the circuits and an AND circuit, an OR circuit, or the like can be formed.

The methods and structures described in this embodiment can be combined as appropriate with any of the methods and structures described in the other embodiments.

Embodiment 5

In this embodiment, an example of a semiconductor device (memory device) which includes the transistor described in Embodiment 2, which can hold stored data even when not powered, and which has an unlimited number of write cycles will be described with reference to drawings.

Figure 7A:
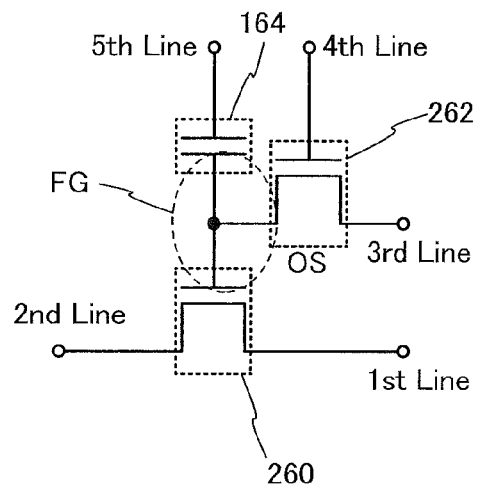
FIGS. 7A to 7C are circuit diagrams and a conceptual diagram of a semiconductor device of one embodiment of the present invention.

FIG. 7A is a circuit diagram illustrating a structural example of the semiconductor device of this embodiment.

A transistor including a semiconductor material (e.g., silicon) other than an oxide semiconductor can be employed to the transistor 260 illustrated in FIG. 7A and thus the transistor 260 is easily operate at high speed. Further, charge can be held in the transistor 262 to which a structure similar to that of the transistor including an oxide semiconductor stack described in Embodiment 2 can be applied for a long time owing to its characteristics.

Although all the transistors are n-channel transistors here, p-channel transistors can be used as the transistors used for the semiconductor device described in this embodiment.

In FIG. 7A, a first wiring (1st Line) is electrically connected to a source electrode layer of the transistor 260, and a second wiring (2nd Line) is electrically connected to a drain electrode layer of the transistor 260. A third wiring (3rd Line) is electrically connected to one of the source electrode layer and the drain electrode layer of the transistor 262, and a fourth wiring (4th Line) is electrically connected to a gate electrode layer of the transistor 262. A gate electrode layer of the transistor 260 and the other of the source electrode layer and the drain electrode layer of the transistor 262 are electrically connected to one electrode of the capacitor 264. A fifth wiring (5th Line) and the other electrode of the capacitor 264 are electrically connected to each other.

The semiconductor device in FIG. 7A can write, hold, and read data as described below, utilizing a characteristic in which the potential of the gate electrode layer of the transistor 260 can be held.

Writing and holding of data will be described. First, the potential of the fourth wiring is set to a potential at which the transistor 262 is turned on, so that the transistor 262 is turned on. Thus, the potential of the third wiring is applied to the gate electrode layer of the transistor 260 and the capacitor 264. In other words, a predetermined charge is supplied to the gate electrode layer of the transistor 260 (i.e., writing of data). Here, charge for supply of a potential level or charge for supply of a different potential level (hereinafter referred to as Low level charge and High level charge) is given. After that, the potential of the fourth wiring is set to a potential at which the transistor 262 is turned off so that the transistor 262 is turned off. Thus, the charge given to the gate electrode layer of the transistor 260 is held (holding).

Since the off-state current of the transistor 262 is extremely low, the charge of the gate electrode layer of the transistor 260 is held for a long time.

Next, reading of data is described. By supplying an appropriate potential (reading potential) to the fifth wiring while supplying a predetermined potential (constant potential) to the first wiring, the potential of the second wiring varies depending on the amount of charge held in the gate electrode layer of the transistor 260. This is because in general, when the transistor 260 is an n-channel transistor, an apparent threshold voltage $V_{th\_H}$ in the case where a High level charge is given to the gate electrode layer of the transistor 260 is lower than an apparent threshold voltage $V_{th\_L}$ in the case where a Low level charge is given to the gate electrode layer of the transistor 260. Here, an apparent threshold voltage refers to the potential of the fifth wiring, which is needed to turn on the transistor 260. Thus, the potential of the fifth wiring is set to a potential $V_0$ which is between $V_{th\_H}$ and $V_{th\_L}$, whereby charge supplied to the gate electrode layer of the transistor 260 can be determined. For example, in the case where High level charge is given in writing, when the potential of the fifth wiring is set to $V_0$ ($>V_{th\_H}$), the transistor 260 is turned on. In the case where Low level charge is given in writing, even when the potential of the fifth wiring is set to $V_0$ ($<V_{th\_L}$), the transistor 260 remains in an off state. Therefore, the stored data can be read by the potential of the second wiring.

Note that in the case where memory cells are arrayed to be used, only data of desired memory cells needs to be read. In the case where such reading is not performed, a potential at which the transistor 260 is turned off regardless of the state of the gate electrode layer, that is, a potential smaller than $V_{th\_H}$ may be supplied to the fifth wiring. Alternatively, a potential at which the transistor 260 is turned on regardless of the state of the gate electrode layer, that is, a potential larger than $V_{th\_L}$ may be supplied to the fifth wirings.

Figure 7B:
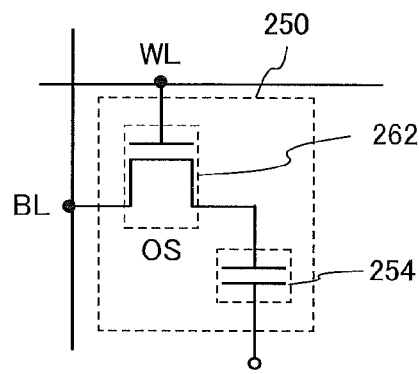
Figure 7C:
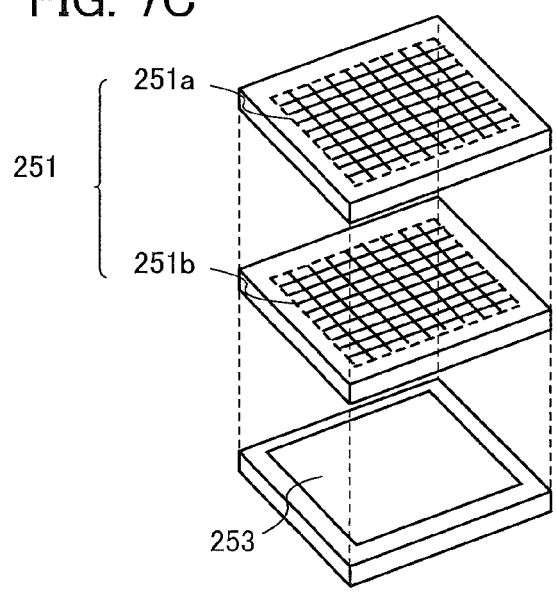

FIG. 7B illustrates an example of one embodiment of a structure of a memory device. FIG. 7B illustrates an example of a circuit configuration of a semiconductor device, and FIG. 7C is a conceptual diagram illustrating an example of a semiconductor device. First, the semiconductor device illustrated in FIG. 7B will be described, and then the semiconductor device illustrated in FIG. 7C will be described.

In the semiconductor device illustrated in FIG. 7B, a bit line BL is electrically connected to the source electrode layer or the drain electrode layer of the transistor 262, a word line WL is electrically connected to the gate electrode layer of the transistor 262, and the source electrode layer or the drain electrode layer of the transistor 262 is electrically connected to a first terminal of a capacitor 254.

Here, the transistor 262 including an oxide semiconductor has extremely low off-state current. For that reason, a potential of the first terminal of the capacitor 254 (or a charge accumulated in the capacitor 254) can be held for an extremely long time by turning off the transistor 262.

Next, writing and holding of data in the semiconductor device (a memory cell 250) illustrated in FIG. 7B are described.

First, the potential of the word line WL is set to a potential at which the transistor 262 is turned on, so that the transistor 262 is turned on. Accordingly, the potential of the bit line BL is supplied to the first terminal of the capacitor 254 (writing). After that, the potential of the word line WL is set to a potential at which the transistor 262 is turned off, so that the transistor 262 is turned off. Thus, the potential of the first terminal of the capacitor 254 is held (holding).

Because the off-state current of the transistor 262 is extremely small, the potential of the first terminal of the capacitor 254 (or the charge accumulated in the capacitor) can be held for a long time.

Secondly, reading of data will be described. When the transistor 262 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 7B can hold charge that is accumulated in the capacitor 254 for a long time because the amount of the off-state current of the transistor 262 is extremely small. In other words, power consumption can be adequately reduced because refresh operation becomes unnecessary or the frequency of refresh operation can be extremely low. Moreover, stored data can be stored for a long time even when power is not supplied.

Next, the semiconductor device illustrated in FIG. 7C will be described.

The semiconductor device illustrated in FIG. 7C includes a memory cell array 251 (memory cell arrays 251a and 251b) including a plurality of memory cells 250 illustrated in FIG. 7B as memory circuits in the upper portion, and a peripheral circuit 253 in the lower portion which is necessary for operating the memory cell array 251 (the memory cell arrays 251a and 251b). Note that the peripheral circuit 253 is electrically connected to the memory cell array 251.

In the structure illustrated in FIG. 7C, the peripheral circuit 253 can be provided directly under the memory cell arrays (the memory cell arrays 251a and 251b). Thus, the size of the semiconductor device can be decreased.

It is preferable that a semiconductor material of a transistor provided in the peripheral circuit 253 be different from that of the transistor 262. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, the transistor can favorably realize a variety of circuits (e.g., a logic circuit or a driver circuit) which needs to operate at high speed.

Note that FIG. 7C illustrates, as an example, the semiconductor device in which two memory cell arrays 251 (the memory cell arrays 251a and 251b) are stacked; however, the number of memory cell arrays to be stacked is not limited thereto. Three or more memory cell arrays may be stacked.

When a transistor including an oxide semiconductor in a channel formation region is used as the transistor 262, stored data can be held for a long time. In other words, power consumption can be sufficiently reduced because a semiconductor device in which refresh operation is unnecessary or the frequency of refresh operation is extremely low can be provided.

Further, the semiconductor device described in this embodiment can be the semiconductor device which is described in Embodiment 1 and in which the oxide semiconductor layers are stacked (i.e., the oxide semiconductor stack) and the second oxide semiconductor layer to be a channel formation region is apart from the surface of the oxide semiconductor stack. Thus, a highly reliable semiconductor device that exhibits stable electrical characteristics can be obtained.

Embodiment 6

In this embodiment, examples of application of the semiconductor device described in any of the above embodiments to electronic devices such as a mobile phone, a smartphone, or an e-book reader will be described with reference to FIG. 8, FIG. 9, FIG. 10, and FIGS. 11A and 11B.

Figure 8:
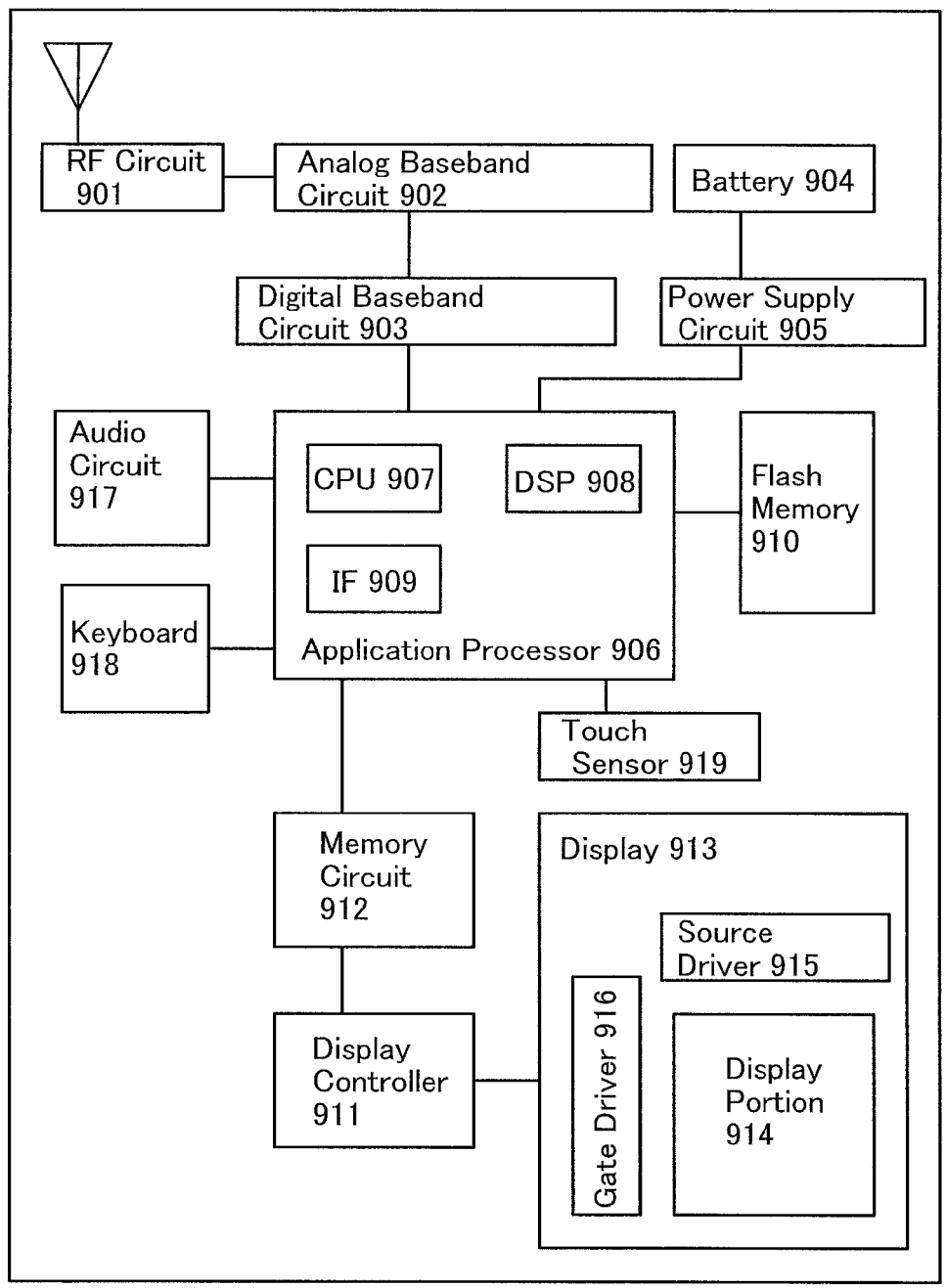
FIG. 8 is a block diagram of a semiconductor device of one embodiment of the present invention.

FIG. 8 is a block diagram of an electronic device. An electronic device illustrated in FIG. 8 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM; by employing the semiconductor device described in any of the above embodiments for the memory circuit 912, it is possible to provide an electronic device in which writing and reading of data can be performed at high speed, data can be held for a long time, power consumption is sufficiently reduced, and the reliability is high.

Figure 9:
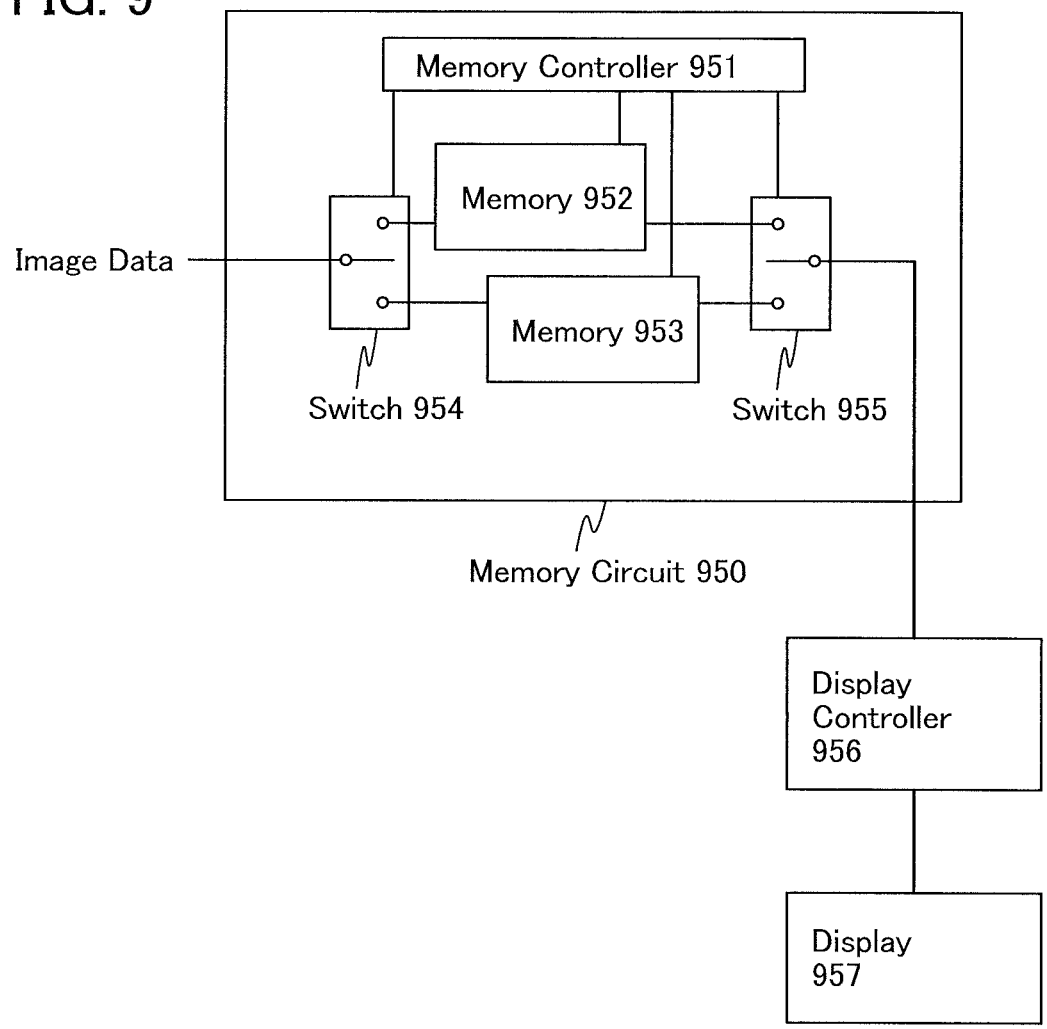
FIG. 9 is a block diagram of a semiconductor device of one embodiment of the present invention.

Next, FIG. 9 shows an example in which the semiconductor device described in any of the above embodiments is used for a memory circuit 950 in a display. The memory circuit 950 illustrated in FIG. 9 includes a memory 952, a memory 953, a switch 954, a switch 955, and a memory controller 951. Further, in the memory circuit, a signal line from image data (input image data), a display controller 956 which reads and controls data held in the memories 952 and 953, and a display 957 which displays data by a signal from the display controller 956 are connected.

First, image data (input image data A) is formed by an application processor (not shown). The input image data A is held in the memory 952 through the switch 954. The image data (stored image data A) held in the memory 952 is transmitted and displayed to the display 957 through the switch 955 and the display controller 956.

In the case where the input image data A is not changed, the stored image data A is read from the memory 952 through the switch 955 by the display controller 956 with a frequency of 30 Hz to 60 Hz in general.

Next, for example, when data displayed on the screen is rewritten by a user (that is, in the case where the input image data A is changed), new image data (input image data B) is formed by the application processor. The input image data B is held in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is held in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced. Further, a semiconductor device which is hardly affected by entrance of water, moisture, and the like from the outside and which has high reliability can be provided.

Figure 10:
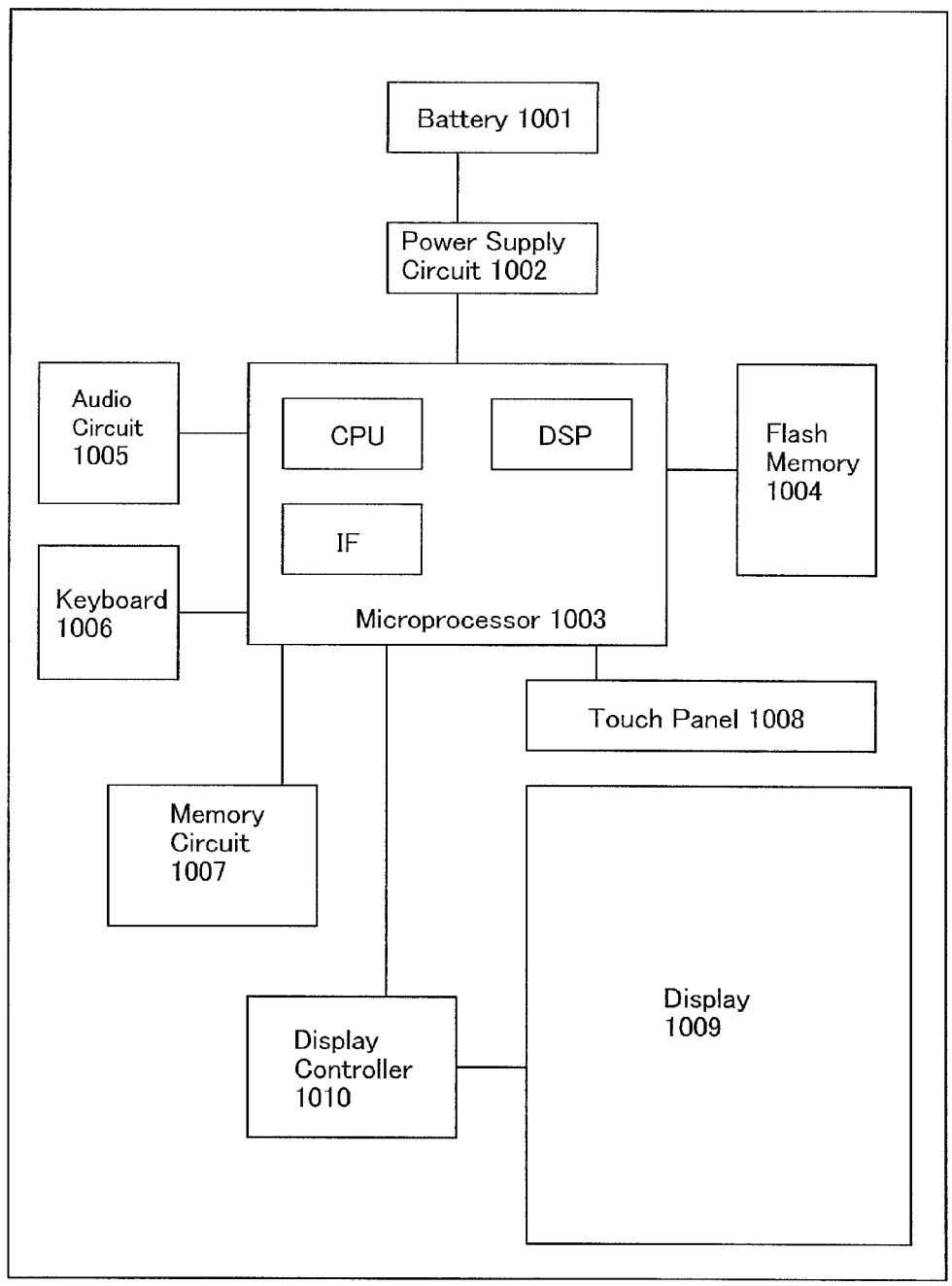
FIG. 10 is a block diagram of a semiconductor device of one embodiment of the present invention.

Next, FIG. 10 is a block diagram of an e-book reader. FIG. 10 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 10. The memory circuit 1007 has a function of temporarily holding the contents of a book. For example, when a user uses a highlight function, the memory circuit 1007 stores and holds data of a portion specified by the user. Note that the highlight function is used to make a difference between a specific portion and the other portions while reading an e-book, by marking the specific portion, e.g., by changing the display color, underlining, making characters bold, changing the font of characters, or the like. In order to store the data for a short time, the data may be stored in the memory circuit 1007. In order to store the data for a long time, the data stored in the memory circuit 1007 may be copied to the flash memory 1004. Also in such a case, by employing the semiconductor device described in any of the above embodiments, data can be written and read at high speed and held for a long time, and power consumption can be sufficiently reduced. Further, a semiconductor device which is hardly affected by entrance of water, moisture, and the like from the outside and which has high reliability can be provided.

Figure 11A:
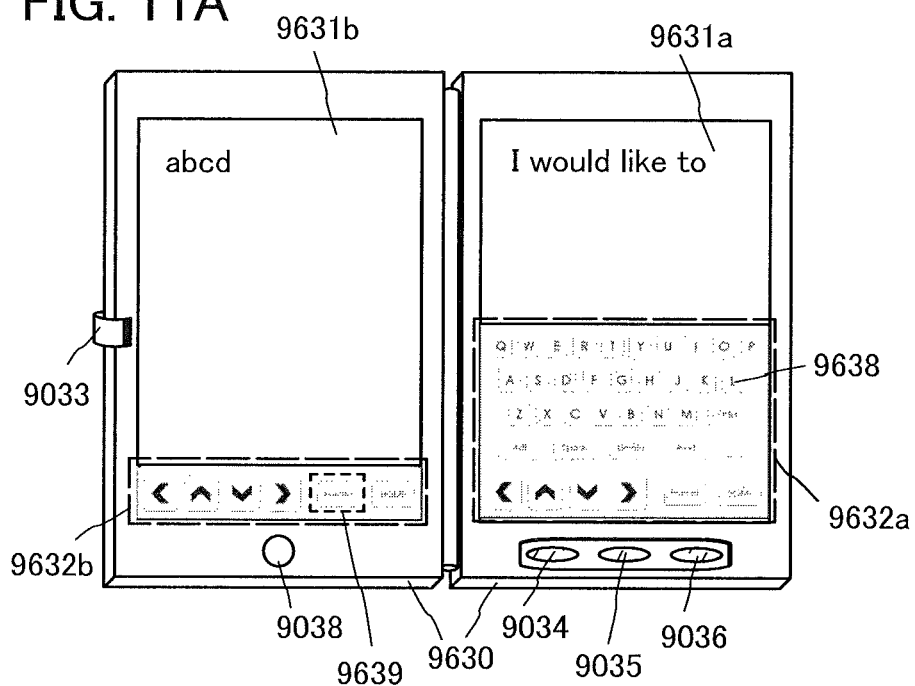
FIGS. 11A and 11B illustrate an electronic device to which a semiconductor device of one embodiment of the present invention can be applied.
Figure 11B:
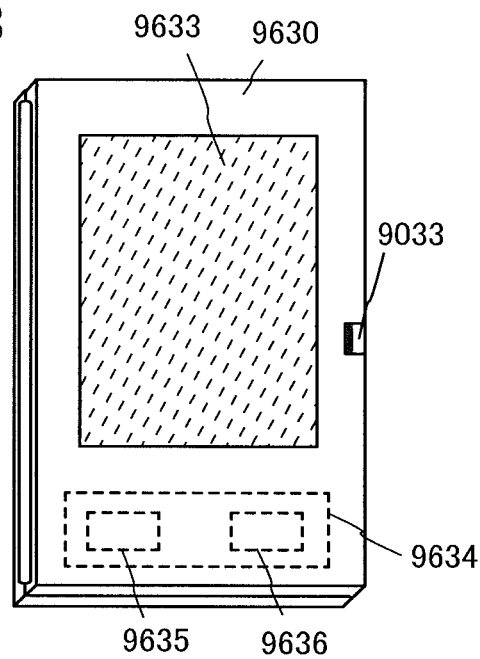

FIGS. 11A and 11B illustrate a specific example of an electronic device. FIGS. 11A and 11B illustrate a tablet terminal that can be folded. The tablet terminal is opened in FIG. 11A. The tablet terminal includes a housing 9630, a display portion 9631a, a display portion 9631b, a display mode switch 9034, a power switch 9035, a power saver switch 9036, a clasp 9033, and an operation switch 9038.

The semiconductor device described in Embodiment 1 can be used for the display portion 9631a and the display portion 9631*b*, so that the tablet terminal can have high reliability. In addition, the memory device described in the above embodiment may be applied to the semiconductor device of this embodiment.

Part of the display portion 9631*a* can be a touch panel region 9632*a*, and data can be input by touching operation keys 9638 that are displayed. Although a structure in which a half region in the display portion 9631*a* has only a display function and the other half region also has a touch panel function is shown as an example, the display portion 9631*a* is not limited to the structure. All the area of the display portion 9631*a* can display keyboard buttons and serve as a touch panel while the display portion 9631*b* can be used as a display screen.

Like the display portion 9631*a*, part of the display portion 9631*b* can be a touch panel region 9632*b*. When a finger, a stylus, or the like touches the place where a button 9639 for switching to keyboard display is displayed in the touch panel, keyboard buttons can be displayed on the display portion 9631*b*.

Touch input can be performed concurrently on the touch panel regions 9632*a* and 9632*b*.

The switch 9034 for switching display modes can switch display orientation (e.g., between landscape mode and portrait mode) and select a display mode (switch between monochrome display and color display), for example. With the switch 9036 for switching to power-saving mode, the luminance of display can be optimized in accordance with the amount of external light at the time when the tablet is in use, which is detected with an optical sensor incorporated in the tablet. The tablet may include another detection device such as a sensor for detecting orientation (e.g., a gyroscope or an acceleration sensor) in addition to the optical sensor.

Although the display portion 9631*a* and the display portion 9631*b* have the same display area in FIG. 11A, an embodiment of the present invention is not limited to this example. The display portion 9631*a* and the display portion 9631*b* may have different areas or different display quality. For example, one of them may be a display panel that can display higher-definition images than the other.

FIG. 11B illustrates the tablet terminal folded, which includes the housing 9630, a solar battery 9633, a charge and discharge control circuit 9634, a battery 9635, and a DC-DC converter 9636. Note that FIG. 11B illustrates an example in which the charge and discharge control circuit 9634 includes the battery 9635 and the DC-DC converter 9636.

Since the tablet can be folded in two, the housing 9630 can be closed when the tablet is not in use. Thus, the display portions 9631*a* and 9631*b* can be protected, thereby providing a tablet with high endurance and high reliability for long-term use.

In addition, the tablet terminal illustrated in FIGS. 11A and 11B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The structures, methods, and the like described in this embodiment can be combined as appropriate with any of the structures, methods, and the like described in the other embodiments.

This application is based on Japanese Patent Application serial No. 2012-178265 filed with Japan Patent Office on Aug. 10, 2012, the entire contents of which are hereby incorporated by reference.

What is claimed is:

1. A semiconductor device comprising:
an oxide semiconductor stack;
a gate electrode layer comprising a region overlapping with the oxide semiconductor stack;
a gate insulating layer between the oxide semiconductor stack and the gate electrode layer; and
a first electrode layer and a second electrode layer electrically connected to the oxide semiconductor stack;
wherein the oxide semiconductor stack includes a first oxide semiconductor layer and a second oxide semiconductor layer comprising a crystalline structure over the first oxide semiconductor layer,
wherein the first oxide semiconductor layer includes a layer expressed as $InM_XZn_YO_Z$ ($X \geq 1$, $Y>1$, $Z>0$, and M is one or more metal elements selected from Ga, Mg, Hf, Al, Sn, Zr, La, Ce, Pr, Nd, Sm, Eu, Gd, Tb, Dy, Ho, Er, Tm, Yb, and Lu),
wherein the second oxide semiconductor layer includes an indium zinc oxide layer, and
wherein an amount of oxygen vacancies of the first oxide semiconductor layer in a top side of the first oxide semiconductor layer is lower than an amount of oxygen vacancies of the first oxide semiconductor layer in a bottom side of the first oxide semiconductor layer.

2. The semiconductor device according to claim 1, wherein the gate electrode layer is over the gate insulating layer.

3. The semiconductor device according to claim 1,
wherein the oxide semiconductor stack further includes a third oxide semiconductor layer over the second oxide semiconductor layer, and
wherein the third oxide semiconductor layer includes a layer expressed as $InM_XZn_YO_Z$ ($X \geq 1$, $Y>1$, $Z>0$, and M is one or more metal elements selected from Ga, Mg, Hf, Al, Sn, Zr, La, Ce, Pr, Nd, Sm, Eu, Gd, Tb, Dy, Ho, Er, Tm, Yb, and Lu).

4. The semiconductor device according to claim 1, wherein a concentration of silicon contained in the first oxide semiconductor layer is lower than or equal to $3 \times 10^{18}/cm^3$.

5. The semiconductor device according to claim 1, wherein a concentration of carbon contained in the first oxide semiconductor layer is lower than or equal to $3 \times 10^{18}/cm^3$.

6. The semiconductor device according to claim 1,
wherein the second oxide semiconductor layer has a shape having an angle between a bottom surface of the second oxide semiconductor layer and a side surface of the second oxide semiconductor layer, and
wherein the angle is an acute angle.

7. The semiconductor device according to claim 1, wherein the second oxide semiconductor layer comprises a c-axis aligned crystalline oxide semiconductor.

8. The semiconductor device according to claim 1, wherein density of states of the second oxide semiconductor layer is lower than or equal to $3 \times 10^{13}/cm^3$.

9. A semiconductor device comprising:
a first gate electrode layer;
a first gate insulating layer over the first gate electrode layer;
a first oxide semiconductor layer over the first gate insulating layer;
a second oxide semiconductor layer over the first oxide semiconductor layer;
a first electrode layer on and in contact with the second oxide semiconductor layer; and a second electrode layer on and in contact with the second oxide semiconductor layer;

wherein the first oxide semiconductor layer includes an indium zinc oxide layer, wherein the second oxide semiconductor layer includes a layer expressed as $InM_XZn_YO_Z$ ($X \geq 1$, $Y > 1$, $Z > 0$, and M is one or more metal elements selected from Ga, Mg, Hf, Al, Sn, Zr, La, Ce, Pr, Nd, Sm, Eu, Gd, Tb, Dy, Ho, Er, Tm, Yb, and Lu), and wherein an amount of oxygen vacancies of the second oxide semiconductor layer in a bottom side of the second oxide semiconductor layer is lower than an amount of oxygen vacancies of the second oxide semiconductor layer in a top side of the second oxide semiconductor layer.

10. The semiconductor device according to claim 9, further comprises a third oxide semiconductor layer between the second oxide semiconductor layer and the first gate insulating layer, and wherein the third oxide semiconductor layer includes a layer expressed as $InM_XZn_YO_Z$ ($X \geq 1$, $Y > 1$, $Z > 0$, and M is one or more metal elements selected from Ga, Mg, Hf, Al, Sn, Zr, La, Ce, Pr, Nd, Sm, Eu, Gd, Tb, Dy, Ho, Er, Tm, Yb, and Lu).

11. The semiconductor device according to claim 9, wherein a concentration of silicon contained in the second oxide semiconductor layer is lower than or equal to $3 \times 10^{18}/cm^3$.

12. The semiconductor device according to claim 9, wherein a concentration of carbon contained in the second oxide semiconductor layer is lower than or equal to $3 \times 10^{18}/cm^3$.

13. The semiconductor device according to claim 9, wherein the first oxide semiconductor layer has a shape having an angle between a bottom surface of the first oxide semiconductor layer and a side surface of the first oxide semiconductor layer, and wherein the angle is an acute angle.

14. The semiconductor device according to claim 9, wherein the first oxide semiconductor layer comprises a c-axis aligned crystalline oxide semiconductor.

15. The semiconductor device according to claim 9, wherein density of states of the first oxide semiconductor layer is lower than or equal to $3 \times 10^{13}/cm^3$.

16. The semiconductor device according to claim 9, further comprising:

a second gate insulating layer over the first electrode layer, the second electrode layer, and the second oxide semiconductor layer; and a second gate electrode layer over the second gate insulating layer.

17. A semiconductor device comprising:

a first oxide semiconductor layer;

a second oxide semiconductor layer over the first oxide semiconductor layer;

a first electrode layer on and in contact with the second oxide semiconductor layer;

a second electrode layer on and in contact with the second oxide semiconductor layer;

a first gate insulating layer over the second oxide semiconductor layer, the first electrode layer, and the second electrode layer; and a first gate electrode layer over the first gate insulating layer;

wherein the first oxide semiconductor layer includes an indium zinc oxide layer, wherein the second oxide semiconductor layer includes a layer expressed as $InM_XZn_YO_Z$ ($X \geq 1$, $Y > 1$, $Z > 0$, and M is one or more metal elements selected from Ga, Mg, Hf, Al, Sn, Zr, La, Ce, Pr, Nd, Sm, Eu, Gd, Tb, Dy, Ho, Er, Tm, Yb, and Lu), and wherein an amount of oxygen vacancies of the second oxide semiconductor layer in a bottom side of the second oxide semiconductor layer is lower than an amount of oxygen vacancies of the second oxide semiconductor layer in a top side of the second oxide semiconductor layer.

18. The semiconductor device according to claim 17, further comprises a third oxide semiconductor layer between the second oxide semiconductor layer and the first gate insulating layer, and wherein the third oxide semiconductor layer includes a layer expressed as $InM_XZn_YO_Z$ ($X \geq 1$, $Y > 1$, $Z > 0$, and M is one or more metal elements selected from Ga, Mg, Hf, Al, Sn, Zr, La, Ce, Pr, Nd, Sm, Eu, Gd, Tb, Dy, Ho, Er, Tm, Yb, and Lu).

19. The semiconductor device according to claim 17, wherein a concentration of silicon contained in the second oxide semiconductor layer is lower than or equal to $3 \times 10^{18}/cm^3$.

20. The semiconductor device according to claim 17, wherein a concentration of carbon contained in the second oxide semiconductor layer is lower than or equal to $3 \times 10^{18}/cm^3$.

21. The semiconductor device according to claim 17, wherein the first oxide semiconductor layer has a shape having an angle between a bottom surface of the first oxide semiconductor layer and a side surface of the first oxide semiconductor layer, and wherein the angle is an acute angle.

22. The semiconductor device according to claim 17, wherein the first oxide semiconductor layer comprises a c-axis aligned crystalline oxide semiconductor.

23. The semiconductor device according to claim 17, wherein density of states of the first oxide semiconductor layer is lower than or equal to $3 \times 10^{13}/cm^3$.

* * * * *